(12) United States Patent
Cha et al.

(10) Patent No.: US 10,373,693 B2
(45) Date of Patent: Aug. 6, 2019

(54) STORAGE DEVICE AND METHOD OF OPERATING THE STORAGE DEVICE

(71) Applicant: SAMSUNG ELECTRONICS CO., LTD., Suwon-si, Gyeonggi-Do (KR)

(72) Inventors: Sang-Soo Cha, Suwon-si (KR); Young-Seop Shim, Seoul (KR); Dae-Won Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/926,419

(22) Filed: Mar. 20, 2018

(65) Prior Publication Data
US 2018/0342305 A1 Nov. 29, 2018

(30) Foreign Application Priority Data
May 23, 2017 (KR) .................. 10-2017-0063517

(51) Int. Cl.
G11C 16/06 (2006.01)
G11C 16/34 (2006.01)
G11C 16/26 (2006.01)
G06F 13/40 (2006.01)
G06F 13/16 (2006.01)
G11C 11/56 (2006.01)
G11C 13/00 (2006.01)

(52) U.S. Cl.
CPC ...... *G11C 16/3404* (2013.01); *G06F 13/1673* (2013.01); *G06F 13/4068* (2013.01); *G11C 11/5642* (2013.01); *G11C 13/004* (2013.01); *G11C 13/0033* (2013.01); *G11C 13/0035* (2013.01); *G11C 16/26* (2013.01); *G11C 16/3418* (2013.01); *G11C 16/3436* (2013.01); *G11C 16/3495* (2013.01); *G11C 2013/0057* (2013.01)

(58) Field of Classification Search
CPC ..... G11C 16/0483; G11C 16/26; G11C 16/10; G11C 16/08; G11C 11/4093; G11C 11/5642; G11C 16/3495; G11C 16/16; G11C 16/24; G11C 16/28; G11C 7/22; G11C 16/04
See application file for complete search history.

(56) References Cited

U.S. PATENT DOCUMENTS

| 7,770,079 | B2 | 8/2010 | Radke et al. |
| 8,914,696 | B2 | 12/2014 | Chen et al. |
| 9,159,437 | B2 | 10/2015 | Jeon et al. |
| 9,502,117 | B2 | 11/2016 | Chen et al. |

(Continued)

FOREIGN PATENT DOCUMENTS

JP 2006-338789 A 12/2006

*Primary Examiner* — Hien N Nguyen
(74) *Attorney, Agent, or Firm* — Volentine, Whitt & Francos, PLLC

(57) ABSTRACT

A method of operating a storage device includes: performing a background read operation on a nonvolatile memory by using a default read voltage level; performing a read retry operation on the nonvolatile memory by using a corrected read voltage level when the background read operation fails; storing the corrected read voltage level in a history buffer when the read retry operation succeeds; and performing a host read operation on the nonvolatile memory by using the history buffer in response to a read request received from a host.

20 Claims, 22 Drawing Sheets

(56) References Cited

U.S. PATENT DOCUMENTS

| | | |
|---|---|---|
| 9,646,709 B2* | 5/2017 | Reusswig ............ G06F 11/1072 |
| 10,199,111 B1* | 2/2019 | Besinga ................. G11C 16/28 |
| 10,224,102 B2* | 3/2019 | Choi ........................ G11C 7/04 |
| 2013/0185612 A1 | 7/2013 | Lee et al. |
| 2014/0095110 A1 | 4/2014 | Chen et al. |
| 2016/0188231 A1 | 6/2016 | Mittelholzer et al. |
| 2018/0277228 A1* | 9/2018 | Takada ................... G11C 16/28 |
| 2019/0068222 A1* | 2/2019 | Lee .................... H03M 13/1128 |

* cited by examiner

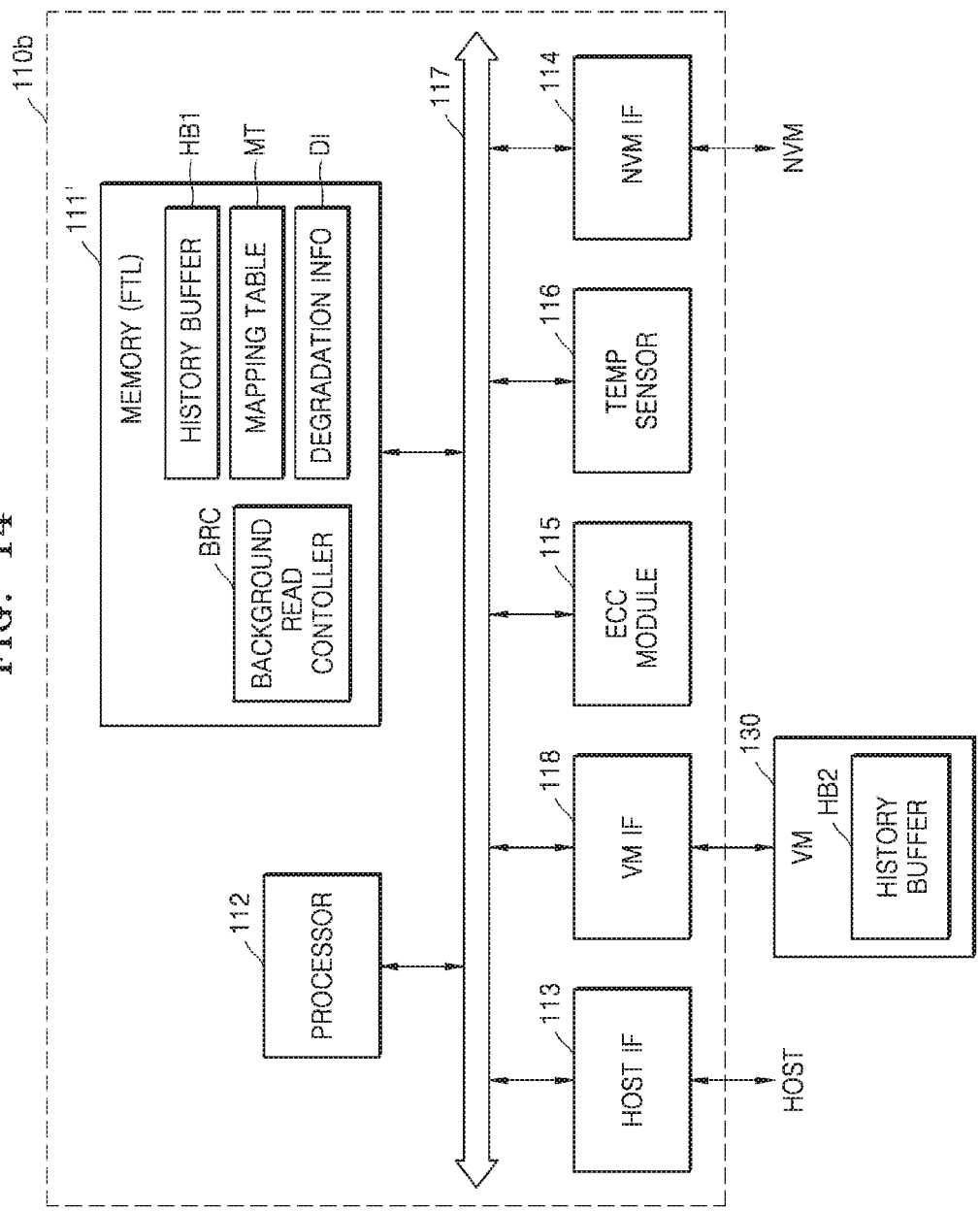

| PBN | FLAG |
|---|---|
| BLK1 | 1 |
| BLK2 | 0 |
| ... | ... |
| BLKn | 1 |

| PBN | CRL |
|---|---|
| BLK1 | CRLa |
| BLK2 | -- |
| ... | ... |
| BLKn | CRLb |

STORAGE DEVICE AND METHOD OF OPERATING THE STORAGE DEVICE

CROSS-REFERENCE TO RELATED APPLICATION

A claim of priority is made to Korean Patent Application No. 10-2017-0063517, filed on May 23, 2017, in the Korean Intellectual Property Office, the disclosure of which is incorporated herein in its entirety by reference.

BACKGROUND

The inventive concepts relate to devices for the storage of data, and more particularly, to storage devices including nonvolatile memory and to methods of operating storage devices including nonvolatile memory.

Flash memory, due in part to its nonvolatile memory characteristics and its ability to be erased and reprogrammed, has recently been adopted in a wide variety of data storage applications, including solid state drives (SSDs) and memory cards. Data is stored in flash memory by programming the threshold voltages of memory cells to one of two or more threshold voltage distributions representing respective logic (bit) values, and data is read from the flash memory by applying one or more predetermined read voltages to the memory cells to determine into which of the threshold voltage distributions the memory cells have been programmed. However, degradation of the memory cells over time can cause the threshold voltages of the memory cells to drift or vary from an originally programmed threshold voltage distribution. This drift in memory cell threshold voltages can result in read errors when applying the predetermined read voltages to the memory cells. Furthermore, even in storage systems which retry the read operation with different read voltage levels when an original read operation produces too many read errors, the time required for such read retry operations can significantly degrade the performance of the storage system, particularly in the case of so-called "cold data" which has not been read or updated in a considerable period of time.

SUMMARY

According to an aspect of the inventive concept, a storage device comprises: a nonvolatile memory including a plurality of memory blocks, wherein each of the memory blocks includes a plurality of pages; a history buffer; and a memory controller configured to execute a background read operation independently of a host device, wherein the background read operation includes scanning the plurality of memory blocks by reading a sampled page among the plurality of pages of each memory block to store corrected read voltage levels for each memory block in the history buffer, and wherein the corrected read voltage level for each memory block is derived from the sampled page of each memory block, wherein the memory controller is further configured to execute, in response to a host read request, a normal read operation of the nonvolatile memory using a corrected read voltage level among the corrected read voltage levels stored in the history buffer.

According to another aspect of the inventive concept, a method is provided for operating a storage device, the storage device including a memory controller and a nonvolatile memory including a plurality of memory blocks, each memory block including a plurality of pages. The method comprises: performing a normal read operation, wherein in the normal read operation the memory controller reads data from the nonvolatile memory according to a read request received from a host device; and performing a background read operation which is executed independently of the host device, wherein in the background read operation the memory controller reads a sampled page among the pages of a target memory block to determine a corrected read voltage level of the sampled page, the corrected read voltage level being stored in a history buffer as the corrected read voltage level for the target memory block, wherein, in the normal read operation having the read request addressing the target memory block, the memory controller retrieves the corrected read voltage level of the target memory block from the history buffer and the nonvolatile memory uses the corrected read voltage level when reading data from the target memory block.

According to another aspect of the inventive concept, a method is provided for compensating for drifting of memory cell threshold voltages in a nonvolatile memory device having a plurality of memory blocks, each of the memory blocks including a plurality of pages. The method comprises: in a background operation scanning the plurality of memory blocks by reading a sampled page among the plurality of pages of each memory block to populate a history buffer storing corrected read voltage levels for each memory block, wherein the corrected read voltage level for each memory block is derived from the scan of the sampled page of each memory block, and receiving a host read request and reading the nonvolatile memory using at least one of the corrected read voltage levels stored in the history buffer.

BRIEF DESCRIPTION OF THE DRAWINGS

Embodiments of the inventive concepts will become readily understood from the detailed description that follows, in conjunction with the accompanying drawings.

FIG. 14 is a block diagram illustrating an example embodiment of a controller of the storage system of FIG. 12.

DETAILED DESCRIPTION OF THE EMBODIMENTS

Figure 1:
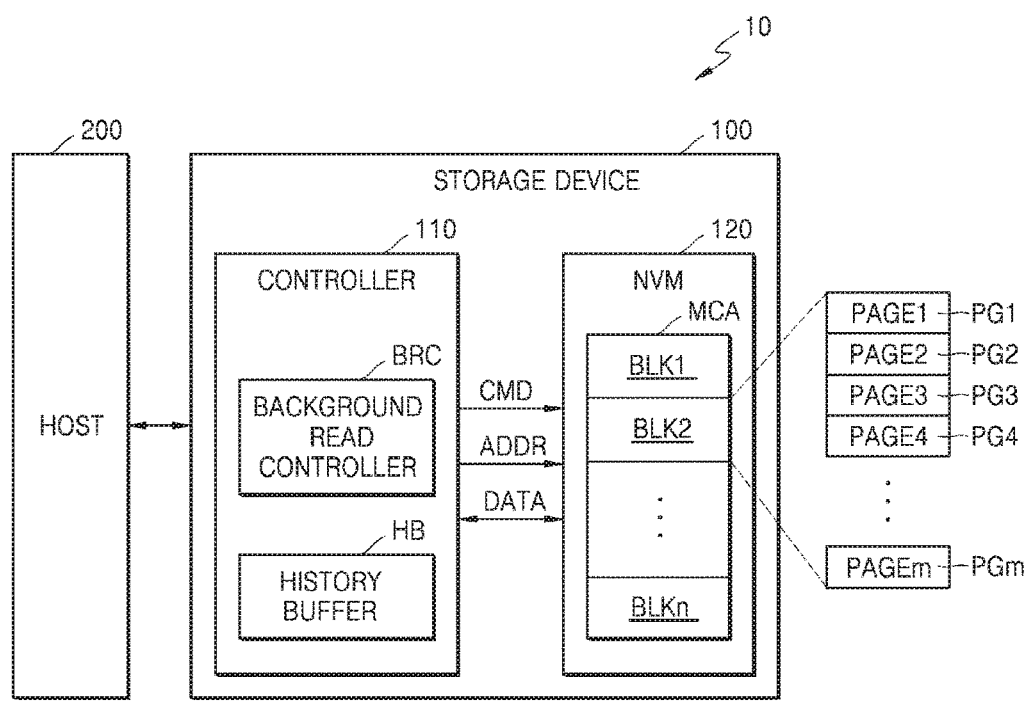
FIG. 1 is a block diagram illustrating an example embodiment of a storage system.

FIG. 1 is a block diagram illustrating an example embodiment of a storage system 10.

Referring to FIG. 1, storage system 10 includes a storage device 100 and a host 200, and, also in this example, storage device 100 includes a controller 110 and a nonvolatile memory (NVM) 120. Host 200, which may communicate with storage device 100 according to one or more of various interface protocols, transmits requests such as a read request and a program (write) request to storage device 100. In one embodiment, host 200 is implemented as an application processor (AP) or a system-on-chip (SoC).

Nonvolatile memory 120 of the example of FIG. 1 includes a memory cell array (MCA), and the memory cell array MCA includes a plurality (n) of memory blocks BLK1 to BLKn. As further shown in the example of FIG. 1, each of the plurality (n) of memory blocks BLK1 to BLKn includes a plurality (m) of pages PG1 to PGm. Herein, "n" and "m" are positive numbers that may be the same as each other or different from each other. Each page PG may be a physical page corresponding, for example, to the memory cells connected to a word line. Alternatively, each page may be a logical page corresponding, for example, to respective logical addresses of the memory cells of a word line. For example, in the case of multilevel cells (MLC), the memory cells of each word line may contain multiple logical pages of data (i.e., one logical page per bit of data stored in each cell).

In the example of this embodiment, a memory block constitutes an erase unit (i.e., data may be erased in units of memory blocks), and a page constitutes a program and read unit (i.e., data may be programmed and read in units of pages). Also in the example of this embodiment, the memory cell array MCA includes flash memory cells such as NAND flash memory cells. However, the inventive concepts are not limited to flash memory. As examples, in other embodiments, the memory cells of the memory cell array MCA may be resistive memory cells such as resistive RAM (ReRAM) memory cells, phase change RAM (PRAM) memory cells, or magnetic RAM (MRAM) memory cells.

Controller 110 controls nonvolatile memory 120 to read data DATA stored in nonvolatile memory 120 in response to a read request (sometimes referred to as a "host read request") from host 200, and to write data DATA in nonvolatile memory 120 in response to a program request from host 200. In the example embodiment of FIG. 1, controller 110 includes a background read controller (BRC) and a history buffer (HB).

The background read controller BRC of this embodiment controls a background read operation on the plurality of memory blocks BLK1 to BLKn included in nonvolatile memory 120. Herein, the phrase "background read operation" refers to an operation in which the background read controller BRC issues a read command CMD and an address ADDR independently of host 200, i.e., without first receiving a read request from host 200, and then data DATA is read from nonvolatile memory 120 in response to the read command CMD and the address ADDR issued by the background read controller BRC.

As an operational example, the background read controller BRC may perform a normal read operation on memory cell of a selected memory block (e.g., the first memory block BLK1) using a default read voltage level. Hereinafter, the phrase "normal read operation" refers to a read operation performed using a default read voltage level. In the operational example, if the normal read operation fails, the background read controller BRC may then perform a read retry operation on the selected memory block, using a corrected read voltage level that is different from the default read voltage level. Hereinafter, the phrase "read retry operation" refers to a read operation that is performed after the normal read operation, using a corrected read voltage level. In the operational example, if the read retry operation succeeds, the background read controller BRC stores the corrected read voltage level as a history read voltage level in the history buffer HB. Hereinafter, the phrase "history read voltage level" refers to the corrected read voltage level stored in the history buffer HB.

When receiving a read request from host 200, storage device 100 may perform a host read operation using the history read voltage level stored in history buffer HB, when there is a history read voltage level stored in history buffer HB. Hereinafter, the phrase "host read operation" refers a read operation initiated by a read request received from host 200. The host read operation is thus contrasted from the background read operation which initiates a read operation independently of any read request received from host 200. When there is a history read voltage level in the history buffer HB, storage device 100 may perform the host read operation by using the history read voltage level. Hereinafter, the phrase "history read operation" refers a read operation which is performed using history read voltage level stored in history buffer HB. On the other hand, when there is not a history read voltage level stored in the history buffer HB, storage device 100 may perform a normal read operation by using the default read voltage level. Thus, according to the present embodiment, the background read operation and the host read operation may share the same history buffer HB. Accordingly, a significant advantage of storage system 10 and storage device 100 is that the degradation in performance of storage device 100 may be prevented by reducing the number of times that a read retry is performed in the host read operation process.

The background read controller BRC may periodically issue the read command CMD. In an embodiment, the background read controller BRC may issue the read command CMD according to a variable period, and in this case, the period may vary according to various parameters. For example, the various parameters may include a temperature of storage device 100, a program and erase count of the memory blocks BLK1 to BLKn, a read count thereof, and a program elapse time thereof. However, the inventive concept is not limited thereto, and the background read controller BRC may issue the read command CMD according to a fixed period.

The background read controller BRC may sequentially issue a plurality of addresses ADDR to perform a background read operation on all the memory blocks BLK1 to BLKn included in nonvolatile memory 120. In this case, each address ADDR may be transmitted to nonvolatile memory 120 together with the read command CMD. Accordingly, a read operation may be periodically performed even on the memory block that is not frequently accessed by host 200, among the plurality of memory blocks BLK1 to BLKn included in nonvolatile memory 120.

The background read controller BRC may select at least one of the plurality of pages PG1 to PGm included in each of the plurality of memory blocks BLK1 to BLKn as a representative page and issue an address ADDR corresponding to the representative page. For example, the number of representative pages for each of the plurality of memory blocks BLK1 to BLKn may be 2 or 3. For example, the background read controller BRC may issue a read command CMD and an address ADDR corresponding to a representative page of the first memory block BLK1 and then issue a read command CMD and an address ADDR for a representative page of the second memory block BLK2 when a background read operation on the representative page of the first memory block BLK1 is completed.

Storage system 10 and/or host 200 may be implemented, for example, by a personal computer (PC), a data server, a network-attached storage (NAS), an Internet of Things (IoT) device, or a portable electronic device. The portable electronic device may be, for example, a laptop computer, a mobile phone, a smart phone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, or a wearable device.

In some embodiments, storage device 100 may be an internal memory installed in an electronic apparatus. For example, storage device 100 may be a solid state drive (SSD), an embedded Universal Flash Storage (UFS) memory device, or an embedded multimedia card (eMMC). In some embodiments, storage device 100 may be an external memory detachable from an electronic apparatus. For example, storage device 100 may be a UFS memory card, Compact Flash (CF), Secure Digital (SD), Micro Secure Digital (Micro-SD), Mini Secure Digital (Mini-SD), extreme Digital (xD), or a memory stick.

Figure 2:
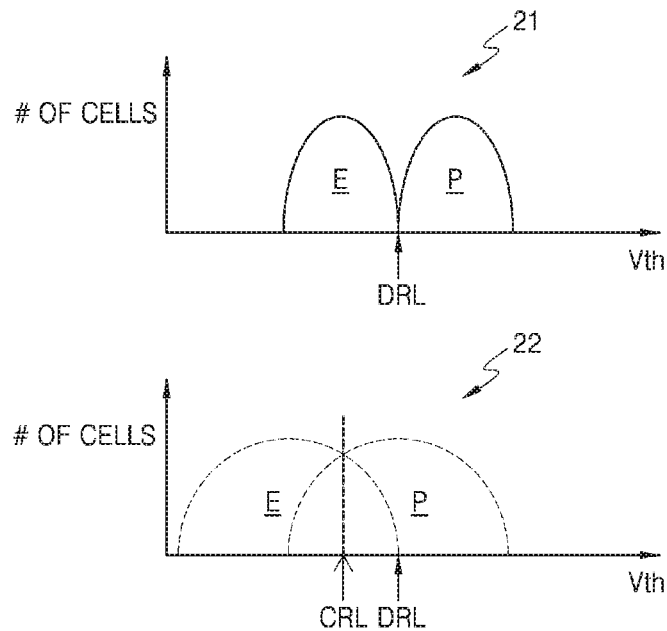
FIG. 2 illustrates an example of a change in threshold voltage level distribution resulting from a drift in threshold voltages of memory cells in a nonvolatile memory of the storage system FIG. 1 due to a degradation.

FIG. 2 illustrates an example of a change in threshold voltage level distribution of memory cells included in nonvolatile memory 120 of storage system 10 of FIG. 1 due to a degradation.

Referring to FIGS. 1 and 2, in an initial distribution 21 and a changed distribution 22, the horizontal axis represents a threshold voltage level Vth and the vertical axis represents the number of memory cells. For example, when a memory cell is a single-level cell programmed in 1 bit, the memory cell may have one of an erase state E and a program state P. Initial distribution 21 may be a distribution within a predetermined time after completion of a program operation on the memory cells. Storage device 100 may use a default read voltage level DRL to determine a program state P.

Changed distribution 22 may be a distribution after a predetermined time has passed after completion of a program operation on the memory cells. When a retention time increases, the memory cells may degrade and the threshold voltage of the degraded memory cells may change in comparison with initial distribution 21. Specifically, when a retention time increases, the electric charge stored in a charge storage layer of the memory cell may leak to a substrate and the threshold voltage of the memory cells may decrease accordingly. In this case, when the default read voltage level DRL is used to perform a read operation on the degraded memory cells, a read error may occur in some of the memory cells programmed in the program state P. Herein, the read error may correspond to a case where the number of fail bits in the read data is greater than a reference number correctable by an error correction code (ECC), and accordingly, the read error may be referred to as an uncorrectable ECC (UECC). In order to remove the read error, it is required to correct the read voltage level by performing a read retry operation with a corrected read voltage level CRL.

In the case of data (hereinafter referred to as "cold data") stored in the memory cells that are not frequently accessed by host 200, a threshold voltage variation may increase according to an increase in the retention time. Thus, when a read request for the cold data is received from host 200, a read error may occur in the normal read operation process using the default read voltage level DRL. In this case, storage device 100 may execute a recovery operation by using recovery code which may be provided in firmware to perform a read retry operation, and in this case, degradation in performance of storage device 100 may occur because a considerable time may be required to execute the recovery operation.

However, according to the present embodiment, the background read controller BRC may perform a read operation on all the memory blocks BLK1 to BLKn included in nonvolatile memory 120 as a background operation regardless of the read request received from host 200 and store a corrected read voltage level CRL in the history buffer HB according to the degradation of the memory blocks BLK1 to BLKn. Thus, when a read request for the cold data is received from the host 200, a read operation may be performed using the corrected read voltage level (i.e., history voltage level) stored in the history buffer HB. Accordingly, since storage device 100 may not need to perform a read retry operation in order to read the cold data, a significant advantage of storage system 10 and storage device 100 is that the above-mentioned degradation in performance of storage device 100 may be prevented.

Figure 3:
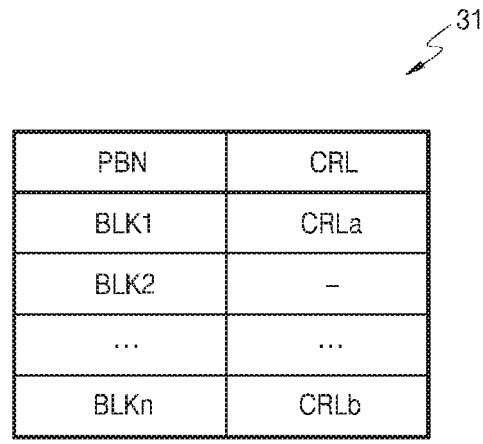
FIG. 3 illustrates an example embodiment of a read history table corresponding to the change in threshold voltage distributions of FIG. 2.

FIG. 3 illustrates an example of a read history table corresponding to the change in threshold voltage distribution of FIG. 2.

Referring to FIGS. 1 to 3, a read history table 31 may be stored in the history buffer HB. Read history table 31 may store corrected read voltage levels CRL corresponding respectively to the plurality of memory blocks BLK1 to BLKn as history read voltage levels. For example, read history table 31 may store the corrected read voltage levels CRL corresponding to a physical block number (PBN) that is a physical block address of nonvolatile memory 120. An operation of generating read history table 31 will be described below.

The background read controller BRC may perform a background read operation on at least one first representative page of the first memory block BLK1. Specifically, the background read controller BRC may perform a normal read operation on the at least one first representative page by using the default read voltage level DRL. When a read error occurs in the at least one first representative page, the background read controller BRC may perform a read retry operation on the at least one first representative page by using a first corrected read voltage level CRLa. When a read error does not occur in the at least one first representative page, the background read controller BRC may store the first corrected read voltage level CRLa as a history read voltage level corresponding to the first memory block BLK1 in read history table 31.

Subsequently, the background read controller BRC may perform a background read operation on at least one second representative page of the second memory block BLK2. Specifically, the background read controller BRC may perform a normal read operation on the at least one second representative page by using the default read voltage level DRL. When a read error does not occur in the at least one second representative page, the background read controller BRC may perform a background read operation on the next memory block without storing a history read voltage level corresponding to the second memory block BLK2 in read history table 31.

In some embodiments, controller 110, and in particular the background read controller BRC, may be configured to perform a first background read operation for nonvolatile memory 120 at a power-on of storage device 100 to initially populate the history buffer HB, or more specifically the history table (e.g., history table 31) of the history buffer HB. Also, in some embodiments, controller 110, and in particular the background read controller BRC, may be configured to perform a second background read operation during a power-on of the storage device to update the history buffer. Here, the first speed of the first background read operation may be greater than the second speed of the second background read operation. Here, power-on may refer to the application of a power supply voltage to storage device 100.

Figure 4:
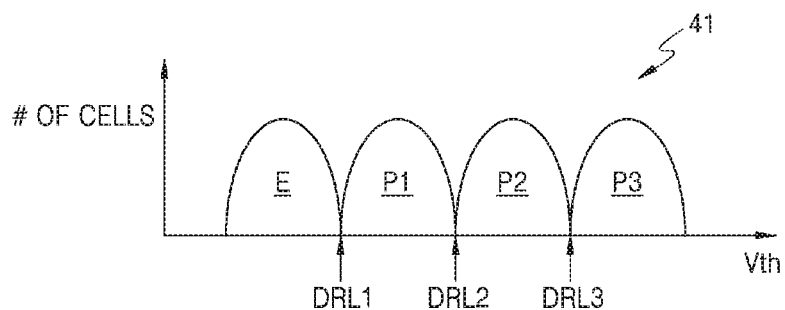
FIG. 4 illustrates another example of a change in threshold voltage distribution of memory cells included in the nonvolatile memory of the storage system of FIG. 1 due to a degradation.

FIG. 4 illustrates another example of a change in threshold voltage level distribution of the memory cells included in nonvolatile memory 120 of storage system 10 of FIG. 1 due to a degradation.

Referring to FIGS. 1 and 4, in an initial distribution 41 and a changed distribution 42, the horizontal axis represents a threshold voltage level Vth and the vertical axis represents the number of memory cells. For example, when a memory cell is a multi-level cell programmed in 2 bits, the memory cell may have one of an erase state E and first to third program states P1 to P3. The initial distribution 41 may be a distribution within a predetermined time after completion of a program operation on the memory cells. Storage device 100 may respectively use first to third default read voltage levels DRL1, DRL2, and DRL3 to determine the first to third program states P1 to P3.

Changed distribution 42 may be a distribution after a predetermined time has passed after completion of a program operation on the memory cells. As in changed distribution 22 illustrated in FIG. 2, when a retention time increases, the memory cells may degrade and the threshold voltages of the degraded memory cells may change in comparison with initial distribution 41. In this case, when the first to third default read voltage levels DRL1 to DRL3 are respectively used to perform a read operation on the degraded memory cells, a read error may occur in some of the memory cells programmed in the first to third program states P1 to P3.

Figure 5:
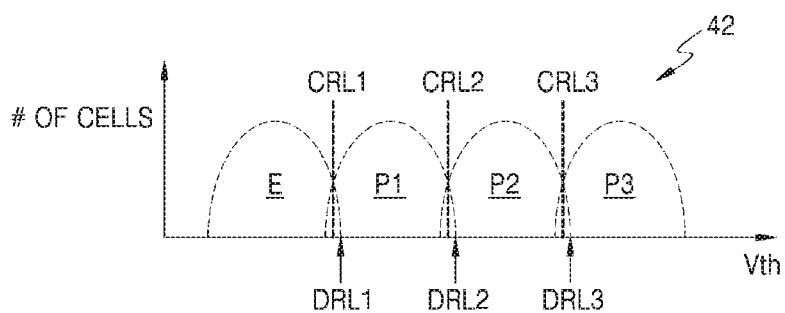
FIG. 5 illustrates an example embodiment of a read history table corresponding to the change in threshold voltage distributions of FIG. 4.

FIG. 5 illustrates an example of a read history table corresponding to the distribution change of FIG. 4].

Referring to FIGS. 1, 4, and 5, a read history table 51 may be stored in the history buffer HB. Read history table 51 may store first to third corrected read voltage levels CRL1 to CRL3 (e.g., CRL1a, CRL1b, CRL2a, CRL2b, CRL3a, CRL3b, etc.) corresponding respectively to the plurality of memory blocks BLK1 to BLKn as first to third history read voltage levels. For example, read history table 51 may store the first to third corrected read voltage levels CRL1 to CRL3 corresponding to a PBN that is a physical block address of nonvolatile memory 120. Since an operation of generating read history table 51 may be substantially the same as that described above with reference to FIG. 3, redundant descriptions thereof will be omitted for conciseness.

In some embodiments, when a memory cell is a triple-level cell programmed in 3 bits, the memory cell may have one of an erase state and first to seventh program states. In this case, a read history table may store first to seventh corrected read voltage levels corresponding respectively to the plurality of memory blocks BLK1 to BLKn, and an operation of generating the read history table may be substantially the same as that described above with reference to FIG. 3.

The degradation of the memory cells according to the retention time has been described above with reference to FIGS. 2 to 5. However, the inventive concept is not limited thereto, and the memory cells may degrade due to various factors. For example, the threshold voltage of the memory cells may increase due to a read disturb according to the performance of a read operation on an adjacent memory cell. As another example, when a program/erase count of a memory cell increases, the threshold voltage of some memory cells may increase according to the degradation of the endurance of the memory cell. As another example, the threshold voltage of the memory cells may change due to a change in the operating temperature of the memory cells.

In an embodiment, the background read controller BRC may change the period or order of the background read operation based on various degradation information described above, or select or change the representative page of each memory block. Also, in an embodiment, the background read controller BRC may change the period or order of the background read operation based on the physical position of a memory block or select or change the representative page according to the physical position of a page in each memory block.

Figure 6:
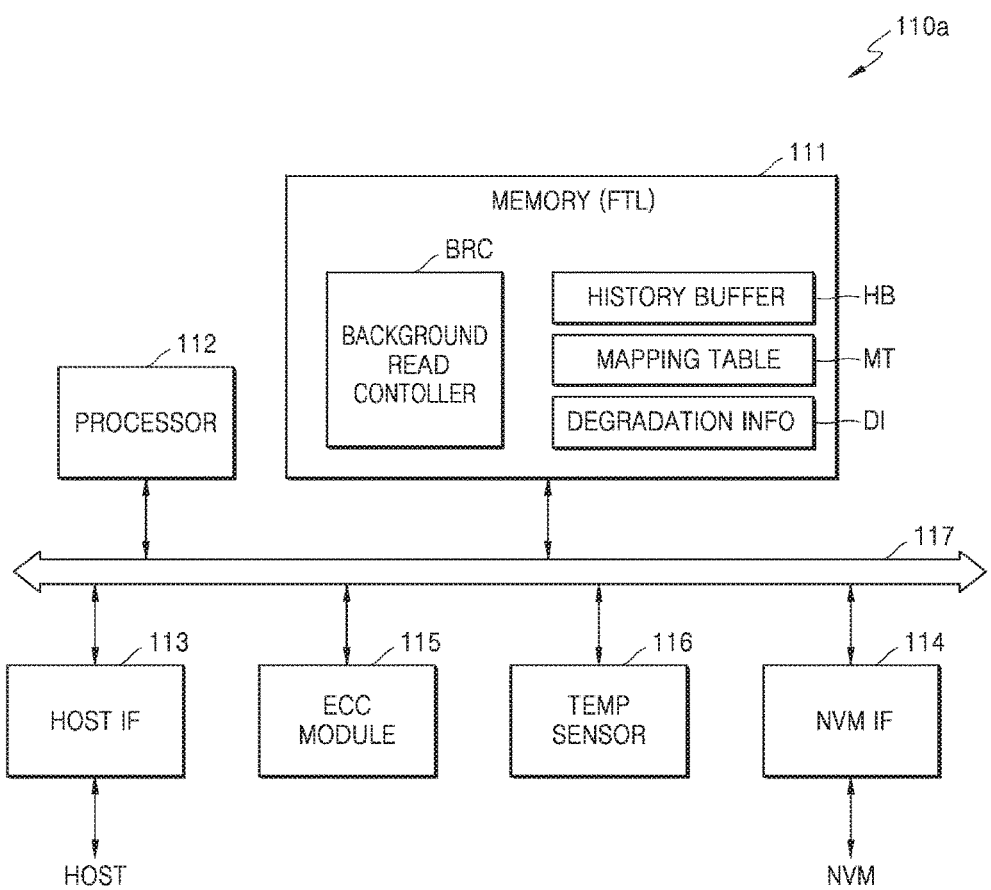
FIG. 6 is a block diagram illustrating an example embodiment of a controller of the storage system of FIG. 1.

FIG. 6 is a block diagram illustrating in detail an example embodiment of the controller of FIG. 1.

Referring to FIG. 6, a controller 110a may include a controller memory 111, a processor 112, a host interface 113, a nonvolatile memory interface 114, an ECC module 115, and a temperature sensor 116 that may communicate with each other through a bus system 117. Processor 112 may include, for example, a central processing unit or a micro-processor and may control an overall operation of controller 110a. Controller memory 111 may operate under the control of processor 112 and may be used, for example, as an operation memory, a buffer memory, or a cache memory. For example, controller memory 111 may be implemented by a volatile memory such as DRAM or SRAM or a nonvolatile memory such as PRAM or flash memory.

The background read controller BRC may be implemented by firmware and/or execution of software and may be loaded into controller memory 111 for example as a background read module. In an embodiment, the background read controller BRC may be implemented in a flash translation layer (FTL) and may be loaded into controller memory 111. However, the inventive concept is not limited thereto, and the background read controller BRC may be implemented by hardware.

For example, the history buffer HB may store read history table 31 of FIG. 3 or read history table 51 of FIG. 5 and may be implemented as a portion of controller memory 111. In an embodiment, the background read controller BRC and the history buffer HB may be implemented together in a same chip. However, the inventive concept is not limited thereto, and the background read controller BRC and the history buffer HB may be implemented in different chips. Also, a mapping table MT may be loaded into controller memory 111. An operation of controller 110a related to the mapping table MT will be described below with reference to FIG. 7.

Figure 7:
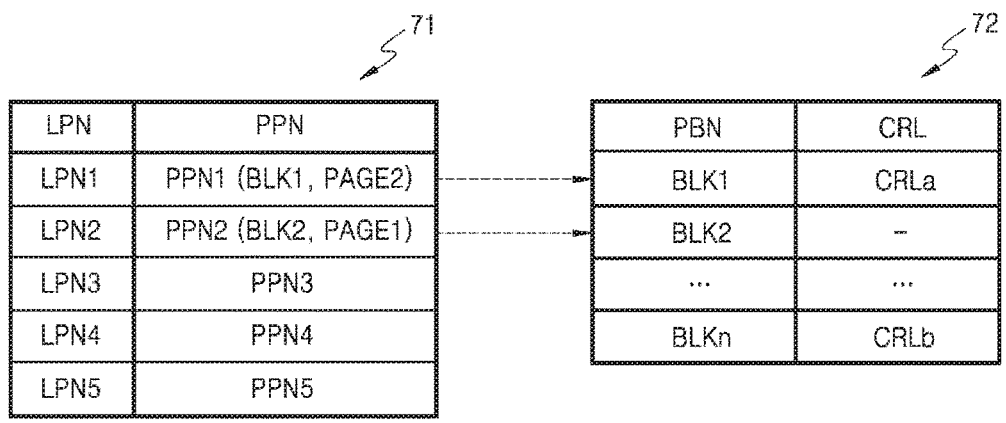
FIG. 7 illustrates examples of an embodiment of an address mapping table and an embodiment of a read history table stored in a memory of the controller of FIG. 6.

FIG. 7 illustrates an example embodiment of the mapping table and an example embodiment of the read history table stored in controller memory 111 of FIG. 6.

Referring to FIGS. 1, 6, and 7, a mapping table 71 may store a plurality of pieces of mapping data for converting a logical address into a physical address and may correspond to an example of the mapping table MT of FIG. 6. Each piece of mapping data may represent a physical page number (PPN) corresponding to a logical page number (LPN). A read history table 72 may store corrected read voltage levels CRL (e.g., CRLa, CRLb, etc.) corresponding respectively to the plurality of memory blocks BLK1 to BLKn as history read voltage levels and may be stored in the history buffer HB of FIG. 6. When a read request and a logical address are received from the host 200, the controller 110a may check a physical address corresponding to the received logical address with reference to the mapping table 71. Subsequently, the controller 110a may check whether a corrected read voltage level corresponding to the physical address is stored in the read history table 72.

For example, when LPN1 is received from host 200, controller 110a may check PPN1 corresponding to LPN1 with reference to mapping table 71. Subsequently, controller 110a may check whether a history read voltage level corresponding to the first memory block BLK1 including PPN1 is stored in read history table 72. Since a corrected read voltage level CRLa is stored in read history table 72 as the history read voltage level corresponding to the first memory block BLK1, the corrected read voltage level CRLa may be used to perform a host read operation on PPN1. In this case, the host read operation may correspond to a history read operation.

For example, when LPN2 is received from host 200, the controller 110a may check PPN2 corresponding to LPN2 with reference to mapping table 71. Subsequently, controller 110a may check whether a history read voltage level corresponding to the second memory block BLK2 including PPN2 is stored in read history table 72. Since a corrected read voltage level corresponding to the second memory block BLK2 is not stored in read history table 72, the default read voltage level may be used to perform a host read operation on PPN2. In this case, the host read operation may correspond to a normal read operation.

Referring to FIG. 6, degradation information DI may be further loaded into controller memory 111. The degradation information DI may include various types of degradation information about the plurality of memory blocks BLK1 to BLKn included in nonvolatile memory 120. For example, the degradation information may include at least one of a program/erase count, a read count, program elapse time information, operation temperature information, and the number of error bits of the read data. In an embodiment, the background read controller BRC may change the period or order of the background read operation based on the degradation information DI, or select or change the representative page of each memory block.

Host interface 113 may provide an interface between host 200 and controller 110a and may provide, for example, an interface according to Universal Serial Bus (USB), MMC, PCIExpress (PCI-E), AT Attachment (ATA), Serial AT Attachment (SATA), Parallel AT Attachment (PATA), Small Computer System Interface (SCSI), Serial Attached SCSI (SAS), Enhanced Small Disk Interface (ESDI), or Integrated Drive Electronics (IDE). Nonvolatile memory interface 114 may provide an interface between controller 110a and nonvolatile memory 120. For example, the degradation information DI, the mapping table MT, write data, and read data may be transmitted between controller 110a and nonvolatile memory 120 through nonvolatile memory interface 114.

By performing an ECC operation on the data received from nonvolatile memory 120, ECC module 115 may detect an error bit in the received data and correct the detected error bit. In an embodiment, ECC module 115 may be implemented by hardware. In an embodiment, ECC module 115 may be implemented by firmware and/or execution of software, and may be loaded into controller memory 111. Temperature sensor 116 may sense an operation temperature of storage device 100. However, in some embodiments, controller 110a may not include temperature sensor 116. Also, in some embodiments, temperature sensor 116 may be implemented as a portion of nonvolatile memory 120.

Figure 8:
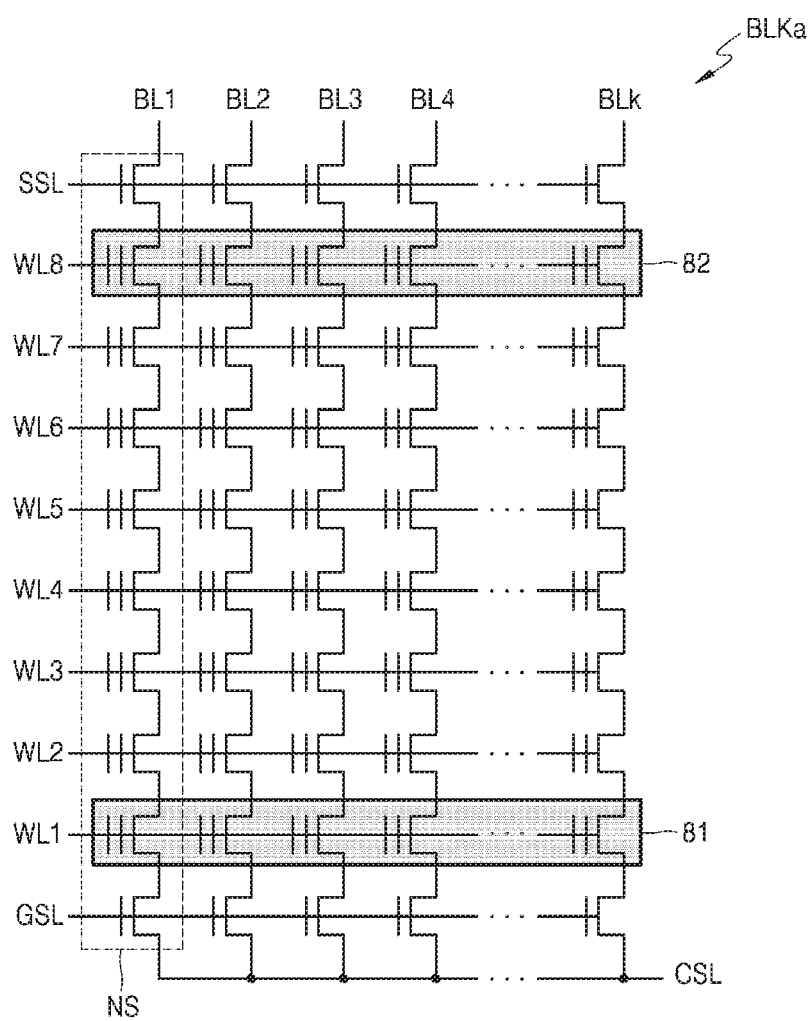
FIG. 8 is a circuit diagram illustrating an example embodiment of a memory block included in the nonvolatile memory of the storage system of FIG. 1.

FIG. 8 is a circuit diagram illustrating an example embodiment of a memory block BLKa included in nonvolatile memory 120 of FIG. 1. Any or all of the memory blocks BLK1 to BLKn of FIG. 1 may be configured as in the example of the memory block BLKa of FIG. 8.

FIG. 8 illustrates a memory block BLKa having a planar NAND flash configuration. As shown, the memory block BLKa of this example includes NAND strings NS, word lines WL1 to WL8, bit lines BL1 to BLk, a ground selection line GSL, a string selection line SSL, and a common source line CSL. Herein, the number of NAND strings, the number of word lines, the number of bit lines, the number of ground selection lines, and the number of string selection lines may be varied from the examples given in connection with FIG. 8.

For example, in the process of a background read operation on the memory block BLKa, among the pages included in the memory block BLKa, a page 81 connected to the first word line WL1 and a page 82 connected to the eighth word line WL8 may be selected as representative pages of the memory block BLKa. However, the number of representative pages is not limited to 2, and the number of representative pages may be 1 in an embodiment and the number of representative pages may be 3 or more in other embodiments. In an embodiment, among a plurality of pages, the page having the largest threshold voltage variation for a predetermined period may be selected as a representative page. In an embodiment, among a plurality of pages, the page having the largest program/erase count may be selected as a representative page. In an embodiment, among a plurality of pages, the page having the largest elapsed time after completion of a program operation may be selected as a representative page.

The background read controller BRC may sequentially perform a background read operation to the representative pages 81 and 82 by sequentially applying the default read voltage level to the first and eighth word lines WL1 and WL8. In this case, when a read error occurs in at least one of representative pages 81 and 82, the background read controller BRC may perform a read retry operation by using a corrected read voltage level. When the read retry operation succeeds, the corrected read voltage level may be stored in a read history table as a history read voltage level corresponding to the memory block BLKa.

Figure 9:
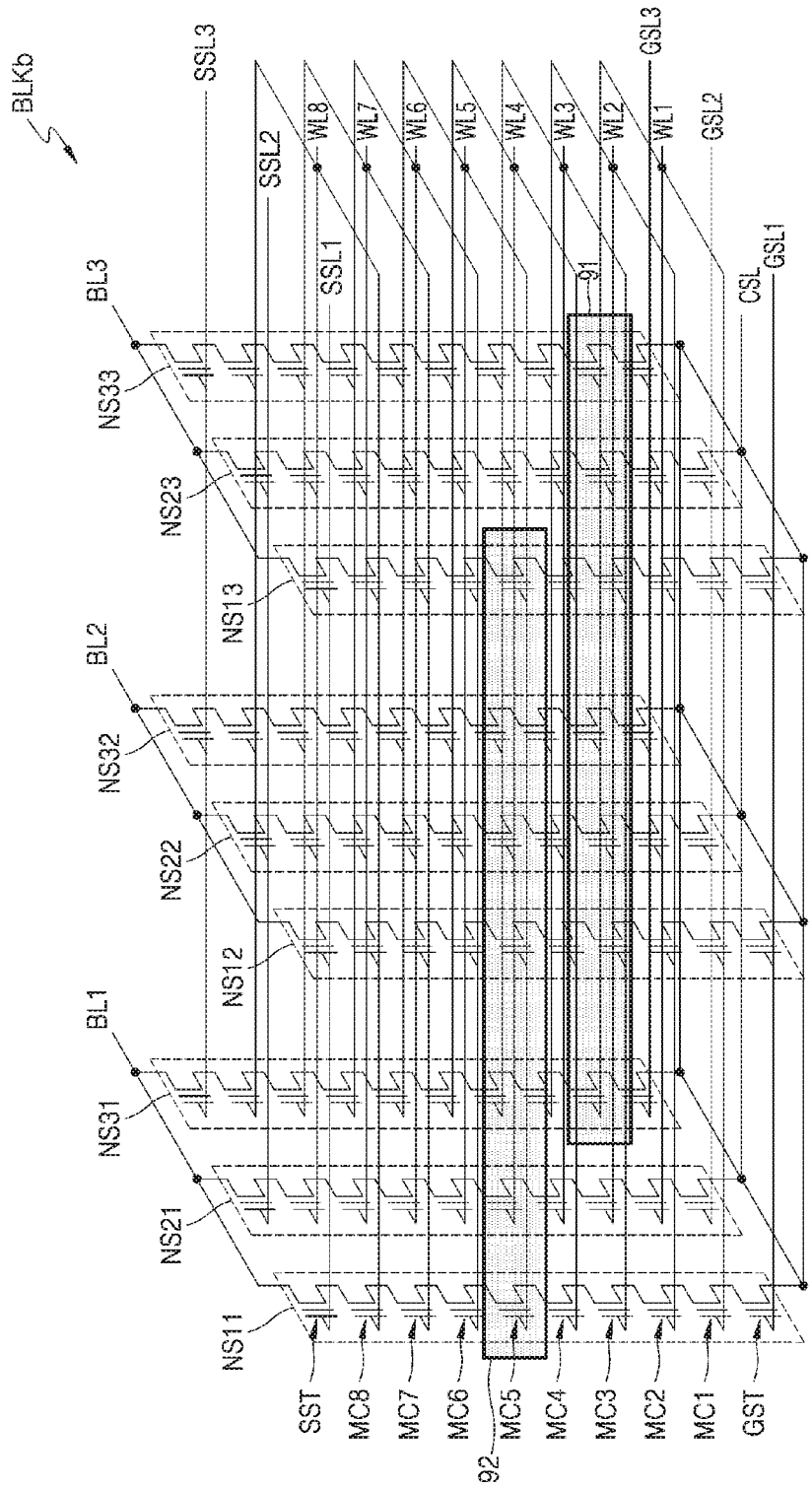
FIG. 9 is a circuit diagram illustrating another example embodiment of a memory block included in the nonvolatile memory of the storage system of FIG. 1.

FIG. 9 is a circuit diagram illustrating another example embodiment of the memory block included in nonvolatile memory 120 of FIG. 1.

Referring to FIG. 9, a memory block BLKb may include NAND strings NS11 to NS33, word lines WL1 to WL8, bit lines BL1 to BL3, ground selection lines GSL1 to GSL3, string selection lines SSL1 to SSL3, and a common source line CSL. Herein, the number of NAND strings, the number of word lines, the number of bit lines, the number of ground selection lines, and the number of string selection lines may vary according to embodiments.

For example, in the process of a background read operation on the memory block BLKb, among the pages included in the memory block BLKb, a page 91 connected to the first word line WL1 and the third string selection line SSL3 and a page 92 connected to the fifth word line WL5 and the first string selection line SSL1 may be selected as representative pages of the memory block BLKb. However, the number of representative pages is not limited to 2, and the number of representative pages may be 1 in an embodiment and the number of representative pages may be 3 or more in other embodiments.

The background read controller BRC may sequentially perform a background read operation on representative pages 91 and 92 by sequentially applying the default read voltage level to the first and fifth word lines WL1 and WL5. In this case, when a read error occurs in at least one of representative pages 91 and 92, the background read controller BRC may perform a read retry operation by using a corrected read voltage level. When the read retry operation succeeds, the corrected read voltage level may be stored in a read history table as a history read voltage level corresponding to the memory block BLKb.

Figure 10:
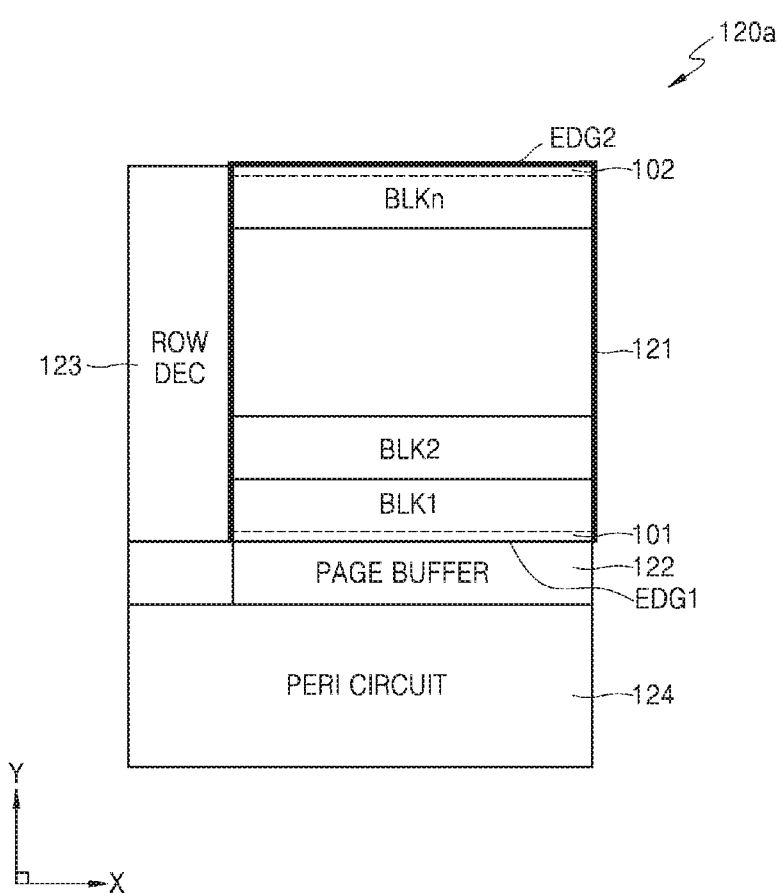
FIG. 10 is a diagram illustrating an example embodiment of the layout of the nonvolatile memory of the memory system of FIG. 1.

FIG. 10 is a layout illustrating an example embodiment of nonvolatile memory 120 of FIG. 1.

Referring to FIG. 10, a nonvolatile memory 120a may include a memory cell array region 121, a page buffer region 122, a row decoder region 123, and a peripheral circuit region 124. The plurality of memory blocks BLK1 to BLKn of FIG. 1 may be arranged in memory cell array region 121. Page buffer region 122 may be adjacent to memory cell array region 121 in a first direction (e.g., a Y direction) and a plurality of page buffers may be arranged therein. Row decoder region 123 may be adjacent to memory cell array region 121 in a second direction (e.g., an X direction) and a plurality of row decoders may be arranged therein. Peripheral circuit region 124 may be adjacent to page buffer region 122 in the first direction and peripheral circuits such as a control logic and a voltage generator may be arranged therein.

In an embodiment, the pages adjacent to first and second edges EDG1 and EDG2 facing each other in memory cell array region 121 may be selected as the representative page of each memory block. A diameter of channel holes adjacent to the first and second edges EDG1 and EDG2 may be less than a diameter of channel holes spaced apart from the first and second edges EDG1 and EDG2. Accordingly, the electrical characteristics of memory cells formed in the channel holes adjacent to the first and second edges EDG1 and EDG2 may be different from the electrical characteristics of memory cells formed in the channel holes spaced apart from the first and second edges EDG1 and EDG2. For example, in the first memory block BLK1, a page 101 that is most adjacent to the first edge EDG1 may be selected as a representative page. For example, in the nth memory block BLKn, a page 102 that is most adjacent to the second edge EDG2 may be selected as a representative page.

Figure 11:
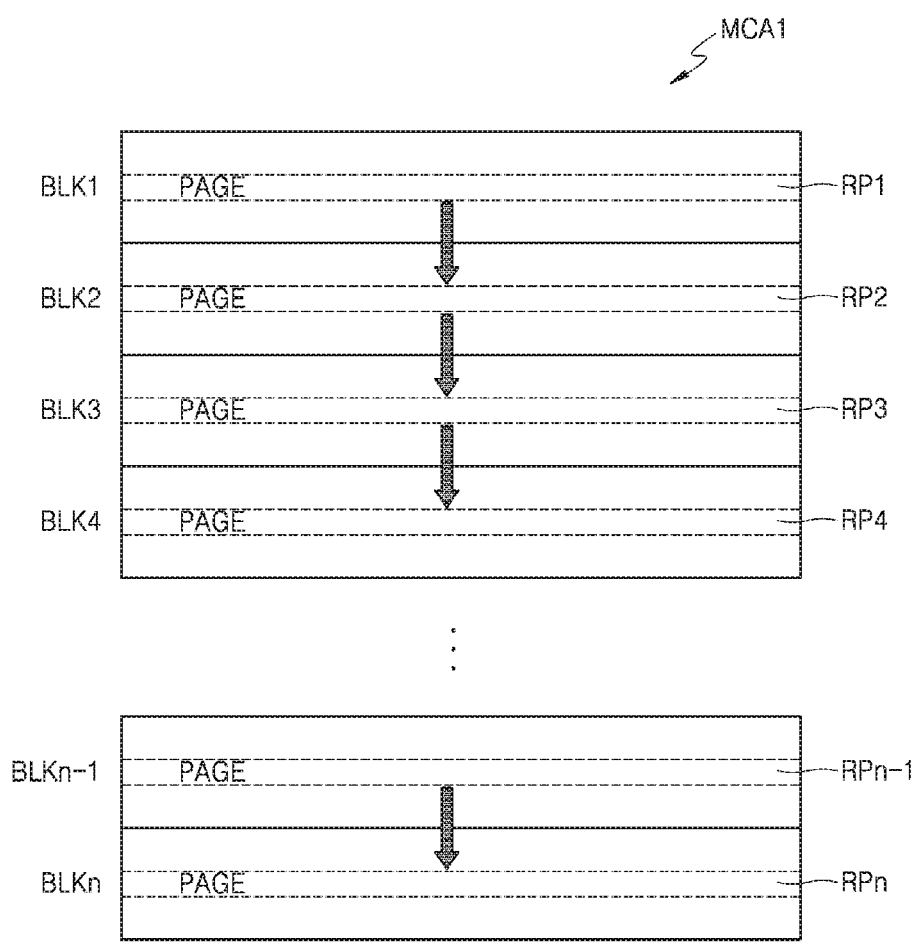
FIG. 11 is a diagram for reference in describing an example of a background read operation.

FIG. 11 illustrates an example of a background read operation.

In the example of FIG. 11, the memory cell array MCA1 includes first to nth memory blocks BLK1, BLK2, BLK3, BLK4 . . . BLKn-1, BLKn and may correspond to an example of the memory cell array MCA of FIG. 1. According to an embodiment, at least one representative page may be selected in each of the memory blocks BLK1 to BLKn, and a background read operation may be performed on the selected representative pages RP1, RP2, RP3, RP4 . . . RPn-1, RPn. The background read operation may be referred to as a "patrol read operation."

The background read controller BRC may periodically perform a background read operation on the first to nth memory blocks BLK1 to BLKn according to the physical addresses. In an embodiment, the performance order of the background read operation may be changed, for example, by the degradation information and the physical position of the first to nth memory blocks BLK1 to BLKn. For example, the background read operation may be performed according to the arrangement order of the first to nth memory blocks BLK1 to BLKn. Specifically, a background read operation may be performed on the first representative page RP1, a background read operation may be performed on the second representative page RP2, and then a background read operation may be performed on the third representative page RP3.

Figure 12:
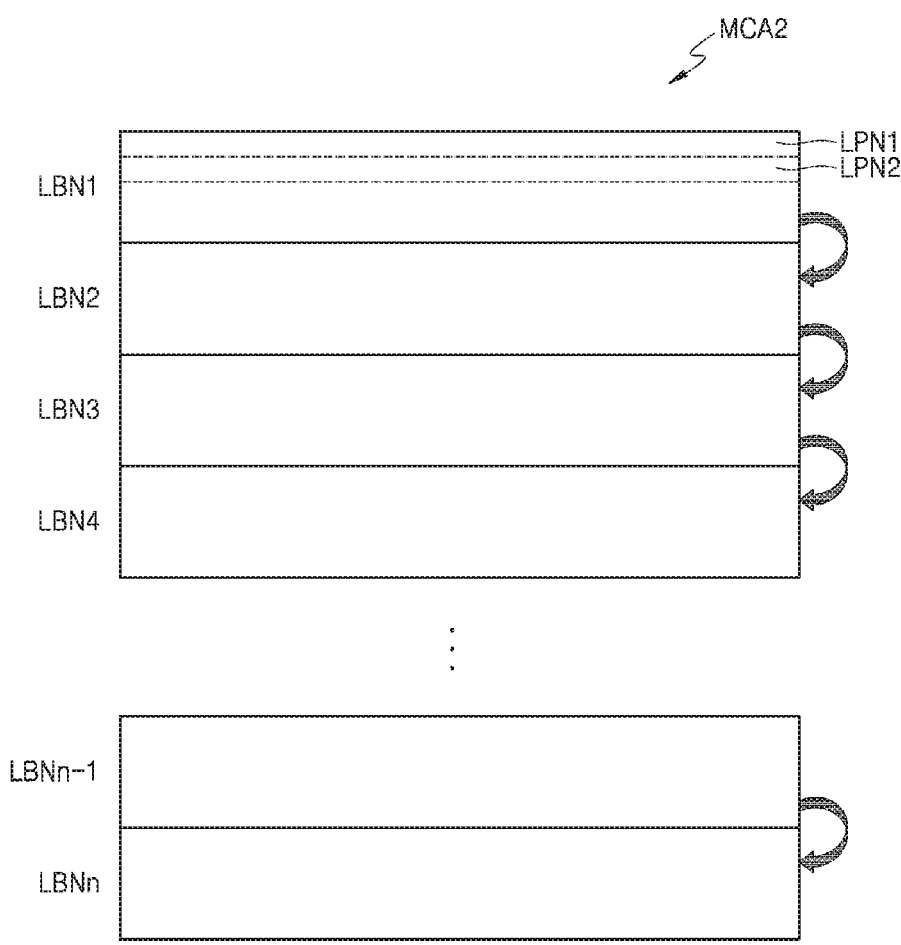
FIG. 12 is a diagram for reference in describing another example of a background read operation.

FIG. 12 illustrates another example of the background read operation.

The memory cell array MCA2 of the example of FIG. 12 includes first to nth logical blocks LBN1 to LBNn. According to an embodiment, a background read operation may be periodically performed on the first to nth logical blocks LBN1 to LBNn based on the logical addresses of the first to nth logical blocks LBN1 to LBNn. The background read operation of this example may be referred to as a "background media scan (BMS)".

The background read controller BRC may periodically perform a background read operation on the first to nth logical blocks LBN1 to LBNn according to the logical addresses. In an embodiment, the performance order of the background read operation may be changed, for example, by the degradation information. For example, a background read operation may be sequentially performed on all the logical pages LPN1 and LPN2 included in the first logical block LBN1, and then a background read operation may be sequentially performed on all the logical pages included in the second logical block LBN2. In an embodiment, storage device 100 may selectively perform a patrol read operation and a BMS operation.

Figure 13:
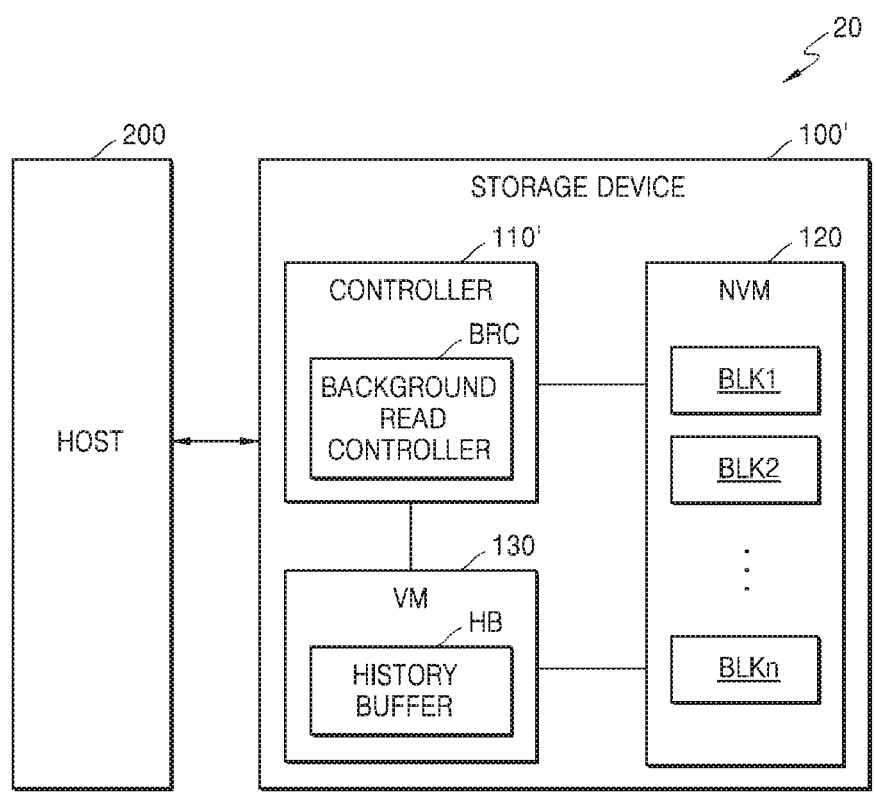
FIG. 13 is a block diagram illustrating an example embodiment of a storage system.

FIG. 13 is a block diagram illustrating an example embodiment of a storage system 20.

Referring to FIG. 13, storage system 20 may include a storage device 100' and a host 200, and storage device 100' may include a controller 110', nonvolatile memory (NVM) 120, and a volatile memory (VM) 130. Storage device 100' is a modified embodiment of storage device 100 of FIG. 1, and redundant descriptions thereof will be omitted for conciseness. Controller 110' may include a background read controller BRC, and the background read controller BRC may be implemented by firmware and/or by a processor executing software. However, the inventive concept is not limited thereto, and the background read controller BRC may be implemented by hardware. A history buffer HB may be implemented in volatile memory 130, and volatile memory 130 may be arranged outside controller 110'.

FIG. 14 is a block diagram illustrating in detail an example embodiment of the controller of FIG. 13.

Referring to FIG. 14, a controller 110b is a modified embodiment of controller 110a illustrated in FIG. 6, and redundant descriptions thereof will be omitted for conciseness. In an embodiment, a first history buffer HB1 may be implemented in a controller memory 111', and a second history buffer HB2 may be implemented in volatile memory 130. For example, controller memory 111' may be SRAM, and volatile memory 130 may be DRAM. For example, the first history buffer HB1 may store a first read history table, and the second history buffer HB2 may store a second read history table. Hereinafter, the first and second read history tables will be described with reference to FIGS. 15A and 15B.

Figure 15A:
FIG. 15A and FIG. 15B illustrate examples of a first read history table and a second read history table.
Figure 15B:
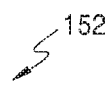

FIGS. 15A and 15B illustrate an example embodiment of a first read history table and an example embodiment of a second read history table.

Referring to FIG. 15A, a first read history table 151 may be stored, for example, in the first history buffer HB1 of FIG. 14. First read history table 151 may store a flag indicating whether a default read voltage level (i.e., a history read voltage level) is applied to each of the plurality of memory blocks BLK1 to BLKn. For example, a flag "1" may indicate that a default read voltage level is not applied, and a flag "0" may indicate that a default read voltage level is applied.

Referring to FIG. 15B, a second read history table 152 may be stored, for example, in the second history buffer HB2 of FIG. 14. Second read history table 152 may store a corrected read voltage level CRL corresponding to each of the plurality of memory blocks BLK1 to BLKn as a history read voltage level. For example, the second read history table 152 may store a corrected read voltage level CRLa corresponding to the first memory block BLK1 and may not store a corrected read voltage level corresponding to the second memory block BLK2. In an embodiment, when a memory cell is a multi-level cell, second read history table 152 may store first to third corrected read voltage levels for respectively reading first to third program states as illustrated in FIG. 5. In an embodiment, when a memory cell is a triple-level cell, second read history table 152 may store first to seventh corrected read voltage levels for respectively reading first to seventh program states.

Referring to FIGS. 1, 15A, and 15B, since a flag of the first memory block BLK1 is "1" in first read history table 151, it may be seen that there is a history read voltage level corresponding to the first memory block BLK1 in second read history table 152. Thus, when a read request for the page included in the first memory block BLK1 is received from host 200, the corrected read voltage level CRLa stored in second read history table 152 may be used to perform a host read operation, that is, a history read operation.

On the other hand, since a flag of the second memory block BLK2 is "0" in first read history table 151, it may be seen that there is not a history read voltage level corresponding to the second memory block BLK2 in second read history table 152. Thus, when a read request for the page included in the second memory block BLK2 is received from host 200, the default read voltage level may be used to perform a host read operation, that is, a normal read operation.

Figure 16:
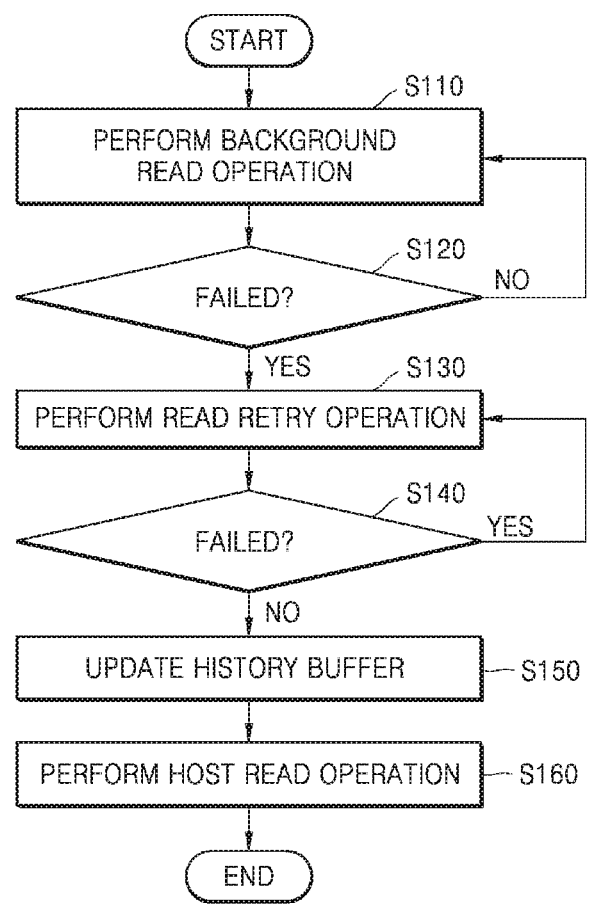
FIG. 16 is a flow diagram for reference in describing an example embodiment of a method of operating a storage device.

FIG. 16 is a flow diagram illustrating an example embodiment of a method of operating a storage device. Referring to FIG. 16, the operating method according to the present embodiment is a method of periodically performing, in the storage device, a background read operation on memory blocks included in a nonvolatile memory. For example, the operating method according to the present embodiment may be sequentially performed in storage device 100 of FIG. 1 or storage device 100' of FIG. 13. The description made above with reference to FIGS. 1 to 15B may also be applied to the present embodiment.

In operation S110, a background read operation is performed. Without receiving a read request from host 200, by using a default read voltage level, storage device 100 may periodically perform a background read operation on the plurality of memory blocks BLK1 to BLKn included in nonvolatile memory 120. In operation S120, whether the background read operation fails is determined. As a result of the determination, when the background read operation fails (i.e., a read fail occurs), then operation S130 is performed, and otherwise (i.e., when a read pass occurs), then operation S110 is performed on another memory block.

In operation S130, a read retry operation is performed. Storage device 100 may perform a read retry operation on the corresponding memory block by using a corrected read voltage level that is different from the default read voltage level. In operation S140, whether the read retry operation fails is determined. As a result of the determination, when the read retry operation succeeds (i.e., when a read pass occurs), operation S150 is performed. On the other hand, when the read retry operation fails (i.e., when a read fail occurs), operation S130 is again performed.

In operation S150, a history buffer is updated. Storage device 100 may update the history buffer by storing the corrected read voltage level in a read history table as a history read voltage level for the corresponding memory block. In operation S160, a host read operation is performed. When receiving a read request from host 200, storage device 100 may perform a host read operation by using the history buffer.

In some embodiments, the present operating method may further include an operation of selecting a representative page for each memory block before performing operation S110. For example, in each of a plurality of memory blocks, at least one representative page may be selected based on at least one of a program and erase count, a read count, a program elapse time, a read disturb, a program disturb, a physical position of each memory block, and a physical position of each page.

Figure 17:
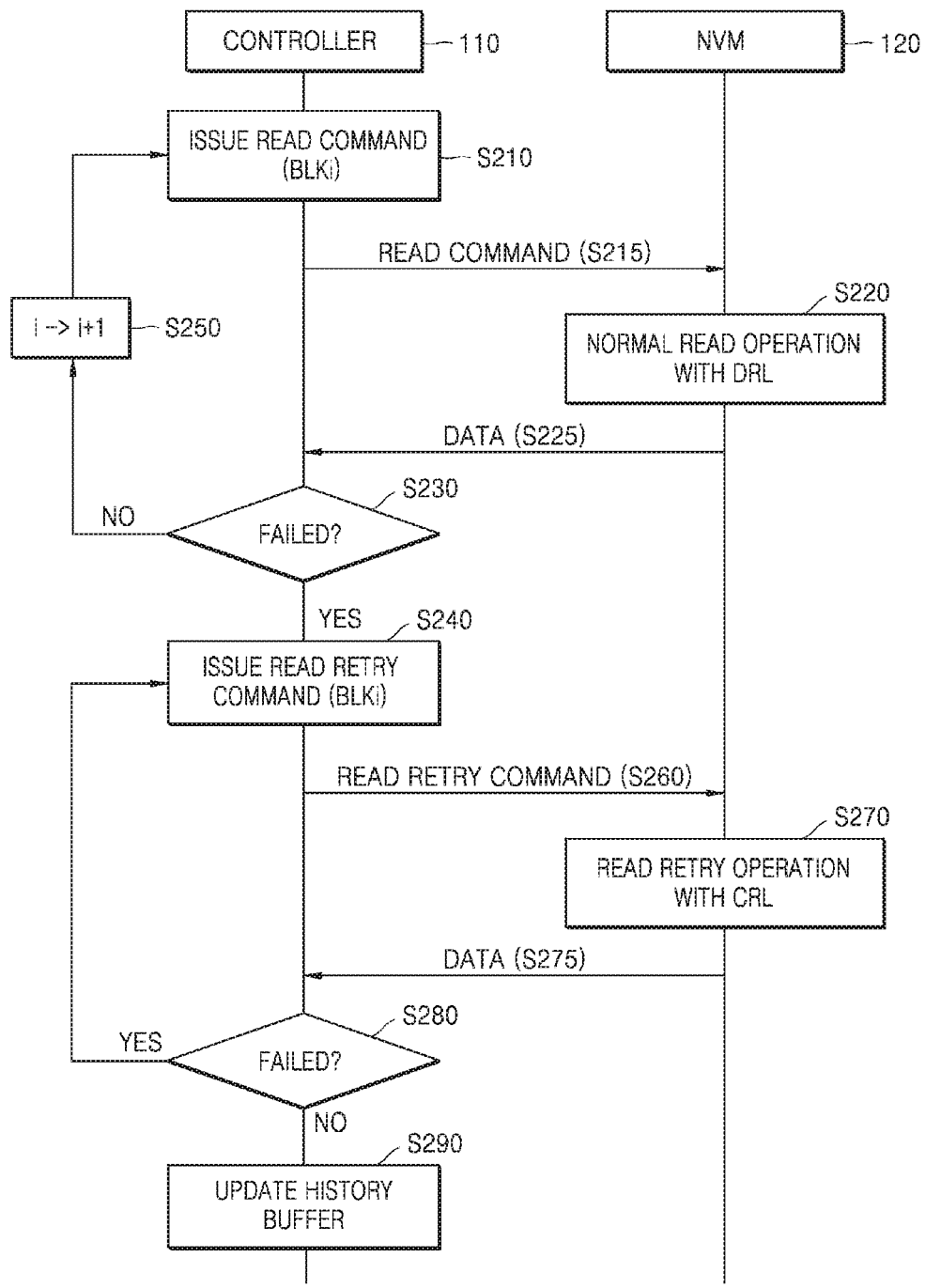
FIG. 17 is a flow diagram for reference in describing exemplary operations between a controller and a nonvolatile memory according to the operating method of FIG. 16.

FIG. 17 is a flow diagram illustrating operations between controller 110 and nonvolatile memory 120 according to the operating method of FIG. 16. Hereinafter, a description will be made with reference to FIGS. 1, 6, and 17.

In operation S210, controller 110 issues a read command for the ith memory block BLKi. Herein, "i" may be any natural number between "1" and "n." Specifically, the background read controller BRC issues a read command without receiving a read request from host 200. Also, the background read controller BRC may issue an address for the representative page included in the ith memory block BLKi and determine a read voltage for the ith memory block BLKi as a default read voltage level DRL. In operation S215, controller 110 transmits a read command to nonvolatile memory 120. In this case, controller 110 may transmit an address to nonvolatile memory 120 together with the read command and transmit a read voltage for the ith memory block BLKi as a control signal.

In operation S220, in response to the read command, nonvolatile memory 120 performs a normal read operation by using the default read voltage level DRL. In this case, nonvolatile memory 120 may perform a normal read operation on a representative page of the ith memory block BLKi. In operation S225, nonvolatile memory 120 transmits data read by the normal read operation to controller 110.

In operation S230, controller 110 determines whether the normal read operation fails (i.e., whether a read fail occurs). Specifically, ECC module 115 may perform an ECC operation on the received data and determine whether the number of fail bits detected in the received data exceeds the error correction capability of ECC module 115. As a result of the determination, when the number of fail bits exceeds the error correction capability, it is determined that the normal read operation fails (i.e., a read fail occurs) and operation S240 is performed. On the other hand, when the number of fail bits does not exceed the error correction capability or when the data does not include a fail bit (i.e., when a read pass occurs), it is determined that the normal read operation succeeds and operation S250 is performed. In operation S250, controller 110 may increase "i" by "1" and perform a background read operation on the (i+1)th memory block.

In operation S240, controller 110 issues a read retry command for the ith memory block BLKi. Specifically, the background read controller BRC issues a read retry command without receiving a read retry request from host 200. Also, the background read controller BRC may issue an address for the read-failed page among the representative pages included in the ith memory block BLKi and determine a read retry voltage for the ith memory block BLKi as a corrected read voltage level CRL. In operation S245, controller 110 transmits a read retry command to nonvolatile memory 120. In this case, controller 110 may transmit an address to nonvolatile memory 120 together with the read retry command and transmit a read retry voltage for the ith memory block BLKi as a control signal.

In operation S270, in response to the read retry command, nonvolatile memory 120 performs a read retry operation by using the corrected read voltage level CRL. In this case, nonvolatile memory 120 may perform a read retry operation on a representative page of the ith memory block BLKi. In operation S275, nonvolatile memory 120 transmits data read by the read retry operation to controller 110.

In operation S280, controller 110 determines whether the read retry operation fails. Specifically, ECC module 115 may perform an ECC operation on the received data and determine whether the number of fail bits detected in the received data exceeds the error correction capability of ECC module 115. As a result of the determination, when the number of fail bits exceeds the error correction capability, it is determined that the normal read operation fails and operation S240 may be again performed. On the other hand, when the number of fail bits does not exceed the error correction capability or when the data does not include a fail bit, it is determined that the read retry operation succeeds and operation S200 is performed. In operation S290, controller 110 updates the history buffer by storing the corrected read voltage level CRL in the read history table.

Figure 18:
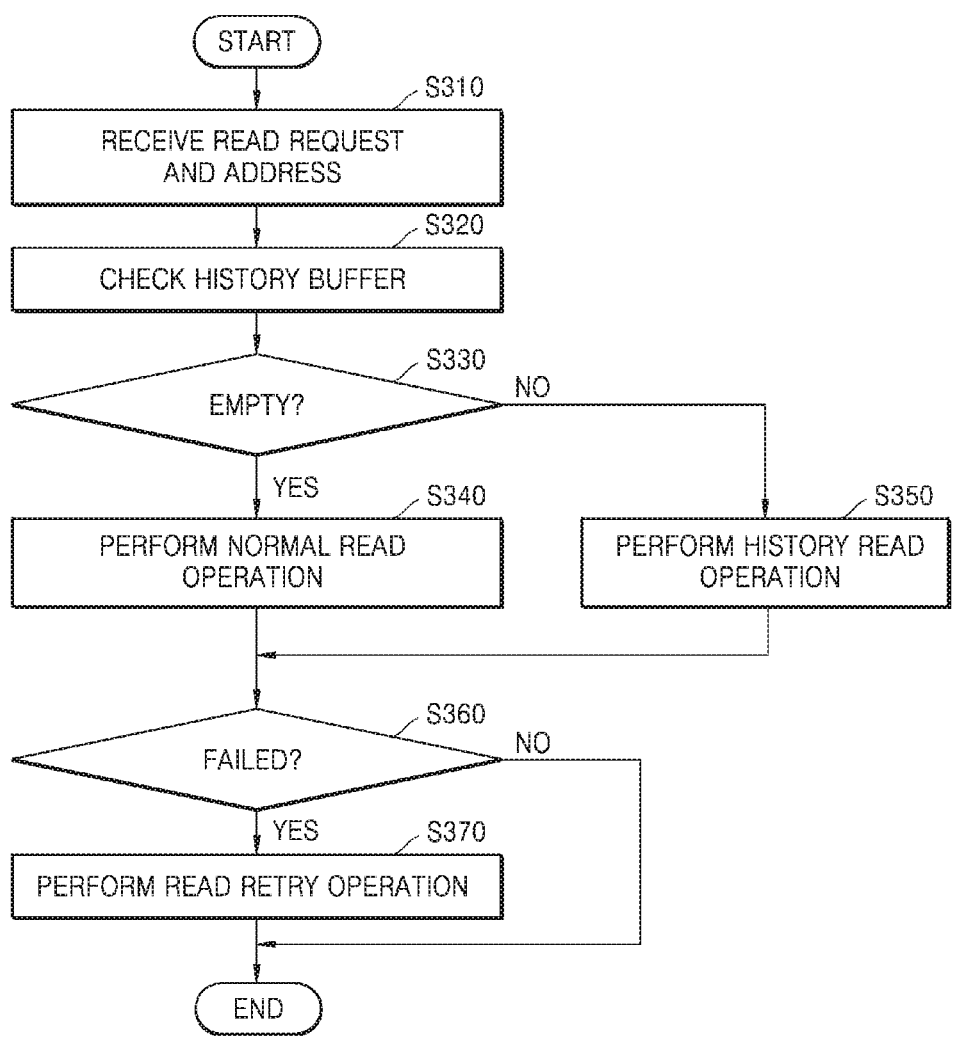
FIG. 18 is a flow diagram for reference in describing another example embodiment of a method of operating a storage device.

FIG. 18 is a flow diagram illustrating an example embodiment of a method of operating a storage device. Referring to FIG. 18, the operating method according to the present embodiment is a method of performing a host read operation in the storage device when a read request is received from a host. For example, the operating method according to the present embodiment may be sequentially performed in storage device 100 of FIG. 1 or storage device 100' of FIG. 13. The description made above with reference to FIGS. 1 to 15B may also be applied to the present embodiment.

In operation S310, a read request and an address are received. Storage device 100 may receive from host 120 a read request and a corresponding read address for the read request. In operation S320, a history buffer is checked. Storage device 100 may check the history buffer to determine whether there is a history read voltage level corresponding to the addressed memory block for the read address for the read request. In operation S330, it is determined whether the history buffer is empty. As a result of the determination, when the history buffer is empty, operation S340 is performed, and otherwise, operation S350 is performed.

In operation S340, a normal read operation is performed. The storage device 100 may perform a normal read operation by using a default read voltage level. In operation S350, a history read operation is performed. The storage device 100 may perform a history read operation by using a history read voltage level. In operation S360, it is determined whether the normal read operation or the history read operation fails. As a result of the determination, when the normal read operation or the history read operation fails, operation S370 is performed, and otherwise, the present method may end. In operation S370, a read retry operation is performed.

Figure 19:
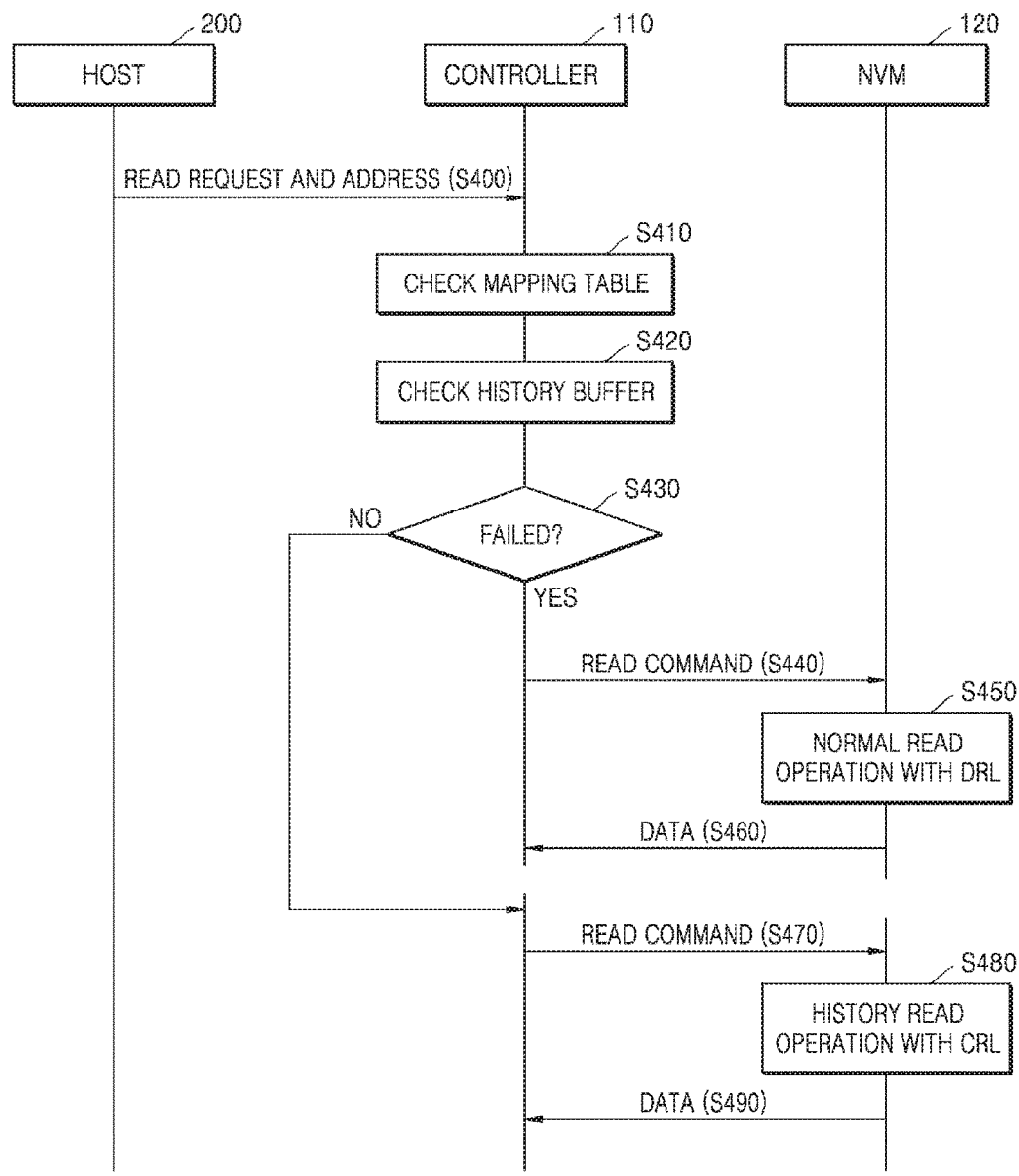
FIG. 19 and FIG. 20 are flow diagrams for reference in describing exemplary operations between a host, a controller, and a nonvolatile memory according to the operating method of FIG. 18.

FIG. 19 is a flow diagram illustrating operations between host 200, controller 110, and nonvolatile memory 120 according to the operating method of FIG. 18. Hereinafter, a description will be made with reference to FIGS. 1, 6, and 19.

In operation S400, host 200 transmits to controller a read request and a corresponding read address for the read request. In this case, the read address transmitted by host 200 is a logical address. In operation S410, controller 110 checks a mapping table. Specifically, controller 110 checks a physical address corresponding to the received logical address. In operation S420, controller 110 checks a history buffer. Specifically, controller 110 checks the history buffer to determine whether there is a history read voltage level corresponding to a memory block including the checked physical address (i.e., the addressed memory block). In operation S430, controller 110 determines whether there is a history read voltage level in the history buffer corresponding to the addressed memory block which includes the checked physical address.

As a result of the determination, when the location in the history buffer corresponding to the addressed memory block is empty, that is, when there is not a history read voltage level corresponding to the addressed memory block, operation S440 is performed. In operation S440, controller 110 transmits a read command to nonvolatile memory 120 for performing a normal read operation with the default read voltage level DRL. In operation S450, nonvolatile memory 120 performs a normal read operation by using the default read voltage level DRL. In operation S460, nonvolatile memory 120 transmits data to controller 110.

On the other hand, when the history buffer is not empty, that is, when there is a history read voltage level corresponding to the addressed memory block, operation S470 is performed. In operation S470, controller 110 transmits a read command to the nonvolatile memory 120 for performing a history read operation with the history read voltage level, that is the corrected read voltage level CRL for the addressed memory block which is found in the history buffer. In operation S480, nonvolatile memory 120 performs a history read operation by using the history read voltage level, that is, the corrected read voltage level CRL. In operation S490, nonvolatile memory 120 transmits data to controller 110.

Figure 20:
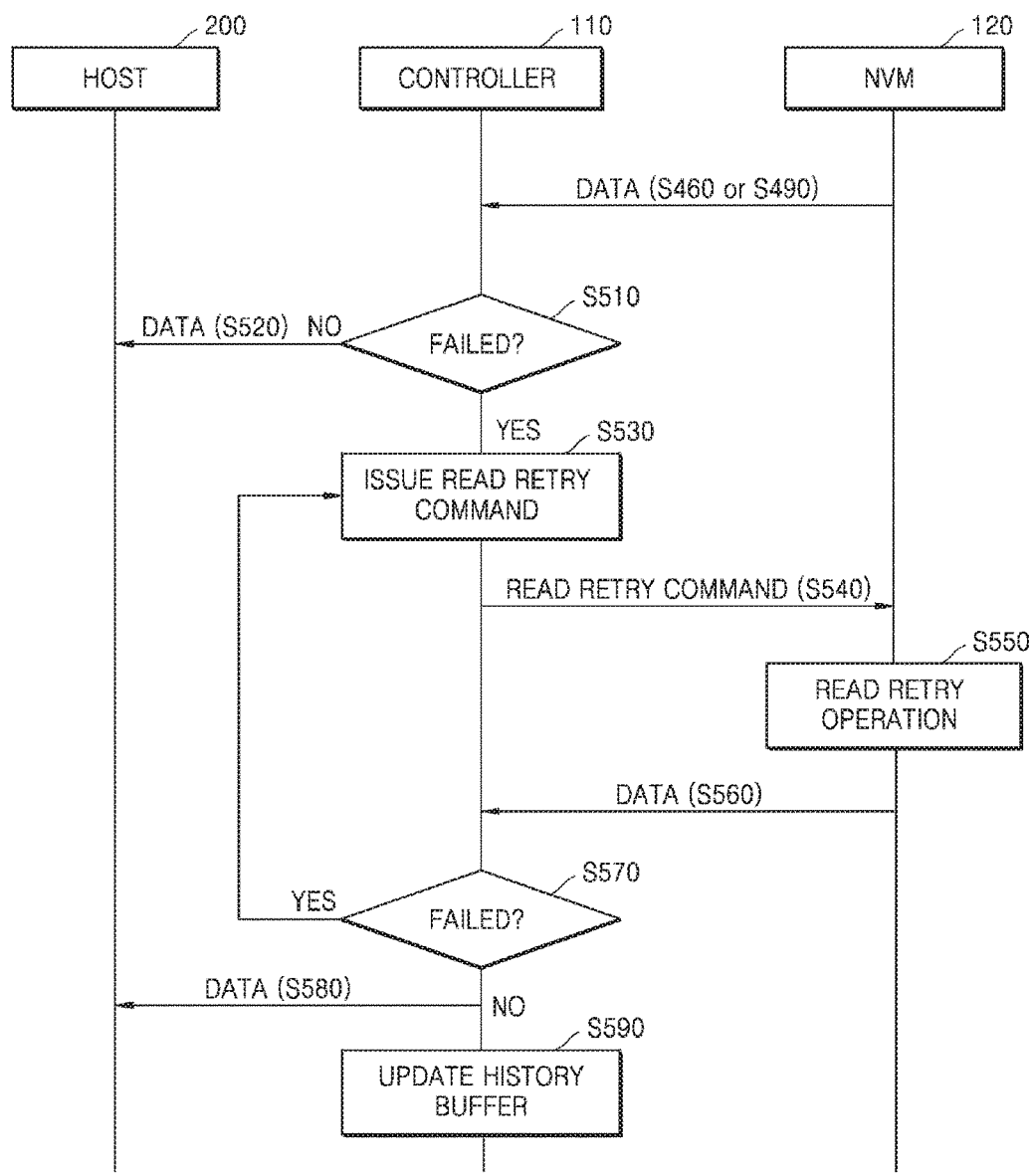

FIG. 20 is a flow diagram illustrating operations between host 200, controller 110, and nonvolatile memory 120 according to the operating method of FIG. 18, which is subsequent to FIG. 19. Hereinafter, a description will be made with reference to FIGS. 1, 6, and 20.

Operation S510 may be performed after operation S460 or S490 of FIG. 19. In operation S510, controller 110 determines whether the normal read operation or the history read operation fails. As a result of the determination, when the normal read operation or the history read operation does not fail, operation S520 is performed. In operation S520, controller 110 transmits data to host 200. On the other hand, when the normal read operation or the history read operation fails, operation S530 is performed.

In operation S530, controller 110 issues a read retry command. In operation S540, the controller 110 transmits the read retry command to nonvolatile memory 120. In operation S550, nonvolatile memory 120 performs the read retry operation by using a corrected read voltage level. In operation S560, nonvolatile memory 120 transmits to controller 110 data which was read using the corrected read voltage level.

In operation S570, controller 110 determines whether the read retry operation again fails. As a result of the determination, when the read retry operation does not fail, operations S580 and S590 are performed. In operation S580, controller 110 transmits data to host 200. In operation S590, controller 110 updates the history buffer by storing the corrected read voltage level in the read history table. In an embodiment, operation S590 may be first performed, and then operation S580 may be performed. In an embodiment, operation S580 and operation S590 may be performed substantially simultaneously. On the other hand, when the read retry operation fails in operation S570, operation S530 may be again performed, or a recovery operation different from operation S530 may be executed. In an embodiment, the present operating method may further include an operation of receiving a next read request and a next read address from the host and an operation of performing a host read operation on the next read address by using the history buffer updated in operation S590.

Figure 21:
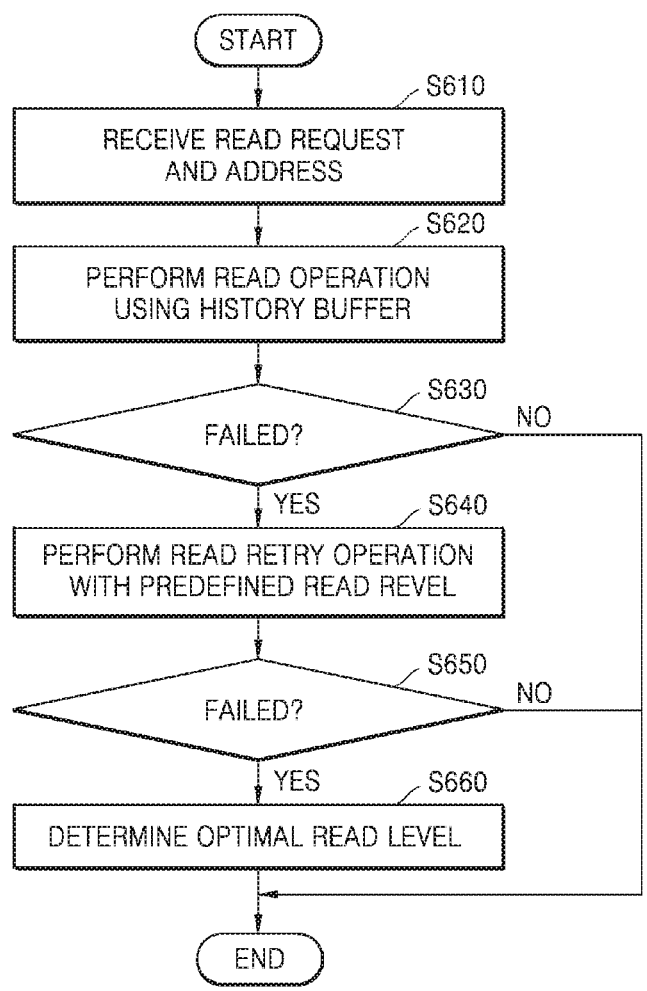
FIG. 21 is a flow diagram for reference in describing another example embodiment of a method of operating a storage device.

FIG. 21 is a flow diagram illustrating an example embodiment of a method of operating a storage device. Referring to FIG. 21, the operating method according to the present embodiment is a method of solving a read error in the storage device when a host read request is received from a host. For example, the operating method according to the present embodiment may be sequentially performed in storage device 100 of FIG. 1 or storage device 100' of FIG. 13. The description made above with reference to FIGS. 1 to 15B may also be applied to the present embodiment.

In operation S610, a read request and an address are received. In particular, storage device 100 or storage device 100' may receive a read request and a corresponding read address for the read request from host 200. In operation S620, a host read operation is performed using a history buffer. Storage device 100 may perform the host read operation as a normal read operation or as a history read operation, by using the history buffer. In operation S630, it is determined whether the host read operation fails. As a result of the determination, when the host read operation fails, operation S640 is performed, and otherwise, the present method ends.

In operation S640, a read retry operation is performed using a predefined read voltage level. Storage device 100 may perform a read retry operation by executing a first recovery procedure, for example by a processor (e.g., processor 112) executing first recovery code. For example, the first recovery procedure may be a predefined table (PDT) procedure. The PDT procedure may be a procedure for performing a read retry operation according to a table storing information about predefined read voltage levels. Specifically, the PDT procedure may estimate a degradation factor based on a degradation occurrence direction and perform a read retry operation by granting a priority to one of a plurality of PDTs. For example, the plurality of PDTs may include a retention table, an endurance table, and a read disturb table. In operation S650, it is determined whether the read retry operation fails. As a result of the determination, when the read retry operation fails, operation S660 is performed, and otherwise, the present method ends.

In operation S660, an optimal read voltage level may be determined. Storage device 100 may determine the optimal read voltage level by executing a second recovery procedure, for example by a processor (e.g., processor 112) executing second recovery code. In an embodiment, storage device 100 may sequentially perform read operations by using at least three read voltage levels and estimate the optimal read voltage level by using the read data. Subsequently, a read operation may be performed using the estimated optimal read voltage level. However, the inventive concept is not limited thereto, and another, different, recovery procedure may be performed in operation S660, and when the read operation using the optimal read voltage level determined in operation S660 fails, still other recovery procedures may be further executed.

In an embodiment, storage device 100 may execute a minimum error search (MES) procedure and may perform, for example, read operations by using equidistant voltage levels around a valley. In an embodiment, storage device 100 may execute a read voltage level swing procedure and may perform, for example, read operations by using voltage levels around the read voltage level determined as the optimal read voltage level in the previous operation. In an embodiment, storage device 100 may perform a monitoring cell search procedure, and may read monitor cells, measure a distribution distortion according to the read result, and adjust the read voltage according to the measurement result. In this case, the monitor cells may be cells that have the same structure as the memory cells, are located at a predetermined position, and are programmed by predetermined data.

Figure 22:
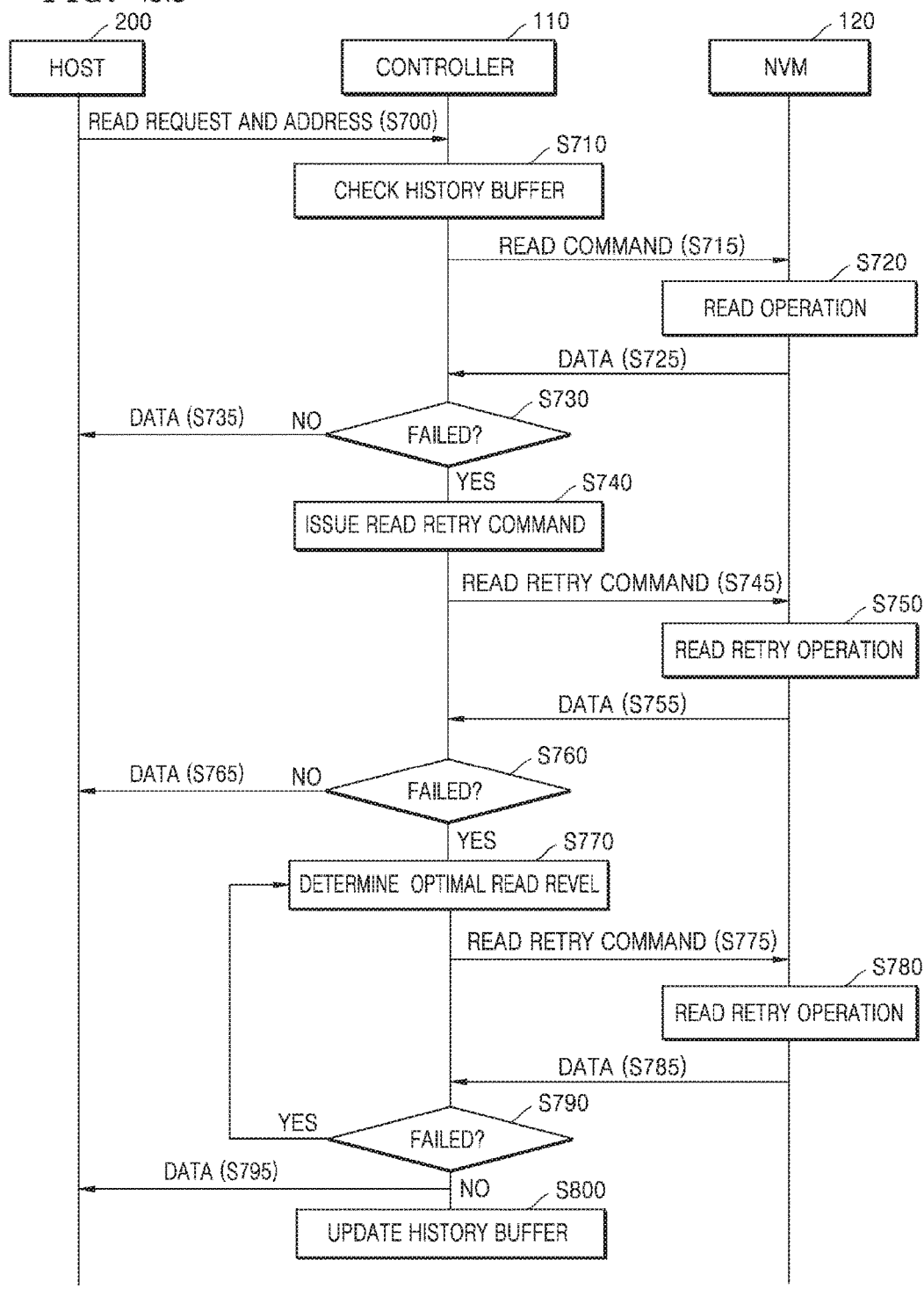
FIG. 22 is a flow diagram for reference in describing exemplary operations between a host, a controller, and a nonvolatile memory according to the operating method of FIG. 21.

FIG. 22 is a flow diagram illustrating operations between host 200, controller 110, and nonvolatile memory 120 according to the operating method of FIG. 21. Hereinafter, a description will be made with reference to FIGS. 1, 6, and 22.

In operation S700, host 200 transmits a read request and a corresponding read address for the read request to controller 110. In operation S710, controller 110 checks a history buffer for a corrected read voltage level for an addressed memory block of the read request from the host. An operation of checking a mapping table may be further included between operations S700 and S710. In operation S715, controller 110 transmits a read command to nonvolatile memory 120. In operation S720, nonvolatile memory 120 performs a read operation in response to the read command. In operation S725, nonvolatile memory 120 transmits data to controller 110.

In operation S730, controller 110 determines whether the read operation fails. As a result of the determination, when the read operation fails, operation S740 is performed, and otherwise, operation S735 is performed. In operation S735, controller 110 transmits the read data to host 200. In operation S740, controller 110 issues a read retry command. In operation S745, controller 110 transmits a read retry command to the nonvolatile memory 120. In operation S750, nonvolatile memory 120 performs a read retry operation by using a new read voltage level. In operation S755, nonvolatile memory 120 transmits data to controller 110 in response to the read retry command.

In operation S760, controller 110 determines whether the read retry operation fails. As a result of the determination, when the read retry operation fails, operation S770 is performed, and otherwise, operation S765 is performed. In operation S765, controller 110 transmits the read data to host 200. Also, controller 110 may update the new read voltage level used in the read retry operation of operation S750 as the history read voltage level in the history buffer.

In operation S770, controller 110 determines an optimal read voltage level. For example, controller 110 may sequentially perform a read retry operation at least three times on nonvolatile memory 120 by using at least three read voltage levels and estimate the optimal read voltage level based on the results of the read retry operations. Specifically, at least three read voltage levels may be sequentially applied to a word line corresponding to an address, and the optimal read voltage level may be estimated based on the data read at each of the at least three read voltage levels.

In operation S775, controller 110 transmits a read retry command to the nonvolatile memory 120. In this case, controller 110 may transmit the optimal read voltage level determined in operation S770 as a control signal. In operation S780, nonvolatile memory 120 performs a read retry operation by using the optimal read voltage level. In operation S785, nonvolatile memory 120 transmits data to controller 110 in response to the read retry command.

In operation S790, controller 110 determines whether the read retry operation fails. As a result of the determination, when the read retry operation fails, operation S770 may be again performed or a read retry operation may be performed by executing another recovery procedure. On the other hand, when the read retry operation succeeds, operations S795 and S800 are performed. In operation S795, controller 110 transmits the read data to host 200. In operation S800, controller 110 updates the history buffer by storing the optimal read voltage level in the read history table. In an embodiment, operation S795 may be first performed, and then operation S800 may be performed. In an embodiment, operation S800 and operation S795 may be performed substantially simultaneously.

Figure 23:
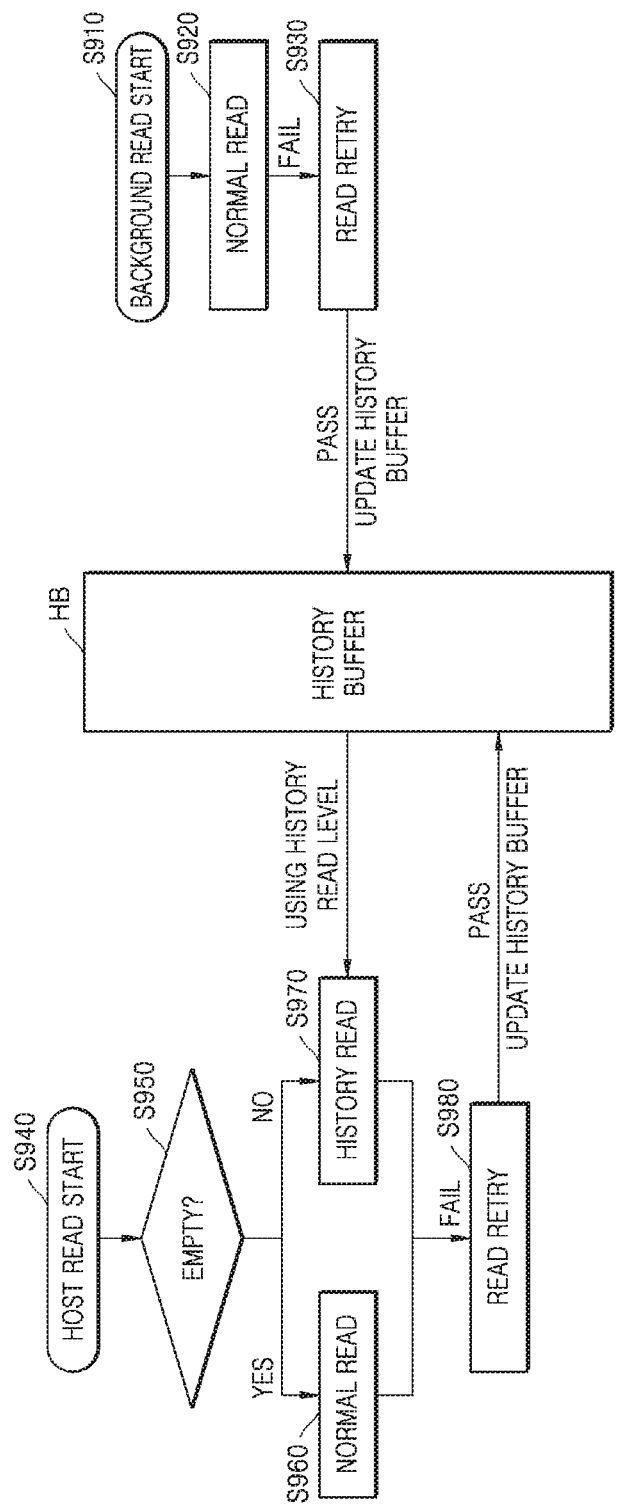
FIG. 23 is a conceptual diagram for reference in describing another example embodiment of a method of operating a storage device.

FIG. 23 is a conceptual diagram illustrating an example embodiment of a method of operating a storage device. Referring to FIG. 23, the operating method according to the present embodiment is a method of sharing the same history buffer HB in the storage device by the background read operation and the host read operation. Herein, the history buffer HB may correspond to the history buffer HB of FIG. 1, the history buffer HB of FIG. 6, the history buffer HB of FIG. 13, or the first and second history buffers HB1 and HB2 of FIG. 14.

In operation S910, a background read operation is initiated with request to one or more memory clocks. In operation S920, a normal read operation is performed using a default read voltage level. In operation S930, when the normal read operation fails for a memory block, a read retry operation is performed using a corrected read voltage level for the memory block. When the read retry operation of operation S930 succeeds, the corrected read voltage level is updated as the history read voltage level for the memory block in the history buffer HB.

In operation S940, a host read operation is initiated for a read address belonging to an addressed memory bock. In operation S950, it is determined whether the history buffer HB is empty for the addressed memory block. In operation S960, when the history buffer HB is empty for the addressed memory block, a normal read operation is performed for the addressed memory block using the default read voltage level. In operation S970, when the history buffer HB is not empty for the addressed memory block, a history read operation is performed using the history read voltage level for the addressed memory block stored in the history buffer HB. When operation S960 or operation S970 fails, a read retry operation is performed in operation S980 by using a new read voltage level. When the read retry operation of operation S980 succeeds, the new read voltage level is updated as the history read voltage level for the addressed memory block in the history buffer HB.

Figure 24:
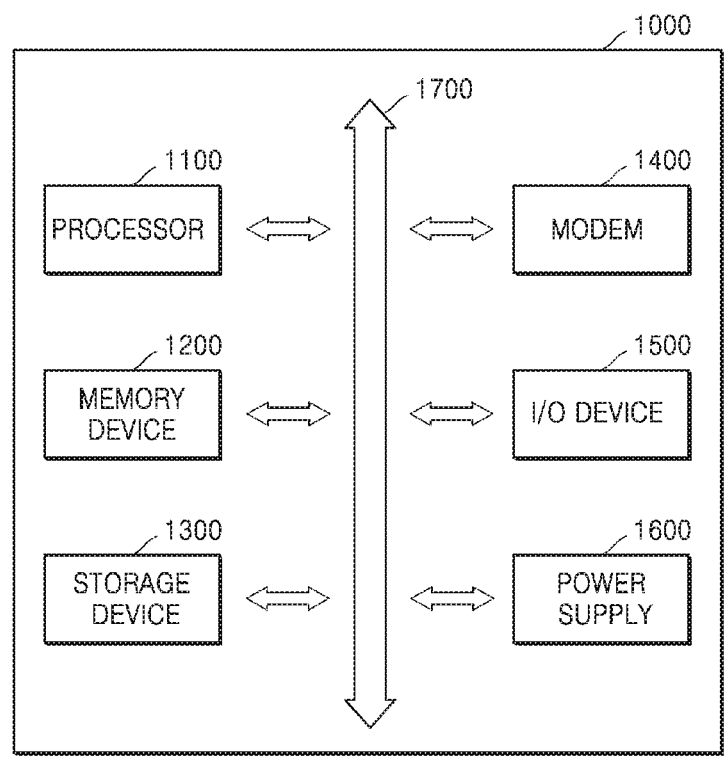
FIG. 24 is a block diagram illustrating an example embodiment of an electronic apparatus.

FIG. 24 is a block diagram illustrating an example embodiment of an electronic apparatus 1000.

Referring to FIG. 24, electronic apparatus 1000 may include a processor 1100, a memory device 1200, a storage device 1300, a modem 1400, an input/output device 1500, and a power supply 1600. In the present embodiment, storage device 1300 may perform a host read operation and a background read operation. Storage device 1300 may periodically perform a background read operation on all the memory blocks and update the history buffer storing the history read voltage level corresponding to the memory blocks according to the result thereof. When receiving a read request from the host, storage device 1300 may perform a normal read operation or a history read operation by using the history buffer. Storage device 1300 may be implemented based on the description made above with reference to FIGS. 1 to 23.

The embodiments of the inventive concept have been described above with reference to the drawings. Although particular terms are used herein to describe the embodiments, they are merely used to describe the technical idea of the inventive concept and are not intended to limit the scope of the inventive concept as described in the following claims. Therefore, those of ordinary skill in the art will understand that various modifications and other equivalent embodiments may be derived therefrom. Thus, the spirit and scope of the inventive concept should be defined by the appended claims.

The various operations of methods described above may be performed by any suitable means capable of performing the operations, such as various hardware and/or software component(s), circuits, and/or module(s).

Any software employed in the disclosed systems and/or methods may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, instructions or code for executing the functions may be stored on or transmitted over a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

While the inventive concept has been particularly shown and described with reference to embodiments thereof, it will be understood that various changes in form and details may be made therein without departing from the spirit and scope of the following claims.

What is claimed is:

1. A storage device, comprising:
a nonvolatile memory including a plurality of memory blocks, wherein each of the memory blocks includes a plurality of pages;
a history buffer; and
a memory controller configured to execute a background read operation independently of a host device, wherein the background read operation includes scanning the plurality of memory blocks by reading a sampled page among the plurality of pages included in each memory block to store corrected read voltage levels for each memory block in the history buffer, and wherein the corrected read voltage level for each memory block is derived from the sampled page of each memory block,
wherein the memory controller is further configured to execute, in response to a host read request, a normal read operation of the nonvolatile memory using one of the corrected read voltage levels stored in the history buffer.

2. The storage device of claim 1, wherein the memory controller comprises a bus system connecting a host interface, a nonvolatile memory interface, a processor and at least one controller memory, the at least one controller memory including a background read module for executing the background read operation in conjunction with the processor.

3. The storage device of claim 2, wherein the at least one controller memory further includes the history buffer.

4. The storage device of claim 1, further comprising a second memory outside the memory controller, wherein the second memory includes the history buffer.

5. The storage device of claim 1, wherein the history buffer is included in a volatile random access memory (RAM), and the memory controller is configured to perform a first said background read operation at a power-on of the storage device to initially populate the history buffer.

6. The storage device of claim 4, wherein the memory controller is further configured to perform a second said background read operation that occurs during a power-on of the storage device to update the history buffer, wherein a first speed of the first said background read operation is greater than a second speed of the second said background read operation.

7. A method of operating a storage device, the storage device including a memory controller and a nonvolatile memory including a plurality of memory blocks, each memory block including a plurality of pages, said method comprising:
performing a normal read operation, wherein in the normal read operation the memory controller reads data from the nonvolatile memory according to a read request received from a host device; and
performing a background read operation which is executed independently of the host device, wherein in the background read operation the memory controller reads a sampled page among the pages of a target memory block to determine a corrected read voltage level of the sampled page, the corrected read voltage level of the sampled page being stored in a history buffer as the corrected read voltage level for the target memory block,
wherein, in the normal read operation having the read request addressing the target memory block, the memory controller retrieves the corrected read voltage level of the target memory block from the history buffer and the nonvolatile memory uses the corrected read voltage level when reading data from the target memory block.

8. The method of claim 7, wherein reading the sampled page among the pages of the target memory block comprises:
reading the sampled page using at least one default read voltage level, wherein some times a result of the reading using the at least one default read voltage level is a read fail and other times a result of the reading using the at least one default read voltage level is a read pass;
when the result of the reading using the at least one default read voltage level is the read fail, executing a read retry operation to determine the corrected read voltage level, and storing the corrected read voltage level in the history buffer as the corrected read voltage level for the target memory block; and
when the result of the reading using the at least one default read voltage level is the read pass, not storing a corrected read voltage level in the history buffer.

9. The method of claim 8, wherein the background read operation includes performing a scan of the plurality of memory blocks by reading a respective sampled page of each of the plurality of memory blocks of the nonvolatile memory to obtain a corresponding plurality of corrected read voltage levels and storing the corresponding plurality of corrected read voltage levels in the history buffer.

10. The method of claim 9, wherein the normal read operation comprises:
checking the history buffer to determine whether a corrected read voltage level is stored in the history buffer for an addressed memory block addressed by the read request from the host device, wherein some times the corrected read voltage level for the addressed memory block is stored in the history buffer and other times the corrected read voltage level for the addressed memory block is not stored in the history buffer;

reading the addressed memory block using the corrected read voltage level when the corrected read voltage level for the addressed memory block is stored in the history buffer; and reading the addressed memory block using the at least one default read voltage level when the corrected read voltage level for the addressed memory block is not stored in the history buffer.

11. The method of claim 9, wherein the history buffer is volatile random access memory (RAM), and the method further comprises a first said scanning at a power-on of the storage device to initially populate the history buffer.

12. The method of claim 11, the method further comprising a second said scanning that occurs during a power-on of the storage device to update the history buffer, wherein a first speed of the first said scanning is greater than a second speed of the second said scanning.

13. The method of claim 7, wherein the history buffer is external to the memory controller.

14. The method of claim 9, wherein each said scanning includes scanning two or more sampled pages of each memory block.

15. A method of compensating for drifting of memory cell threshold voltages in a nonvolatile memory device having a plurality of memory blocks, each of the memory blocks including a plurality of pages, the method comprising:

in a background operation performing a scan of the plurality of memory blocks by reading a sampled page of each memory black among the plurality of pages included in each memory block to populate a history buffer storing corrected read voltage levels for each memory block, wherein the corrected read voltage level for each memory block is derived from the scan of the sampled page of each memory block, and receiving a host read request and reading the nonvolatile memory using at least one of the corrected read voltage levels stored in the history buffer.

16. The method of claim 15, wherein the reading the nonvolatile memory comprises:

checking the history buffer to determine whether a corrected read voltage level for an addressed memory block of the host read request is stored in the history buffer, wherein some times the corrected read voltage level for the addressed memory block is stored in the history buffer and other times the corrected read voltage level for the addressed memory block is not stored in the history buffer;

reading the addressed memory block using the corrected read voltage level stored in the history buffer when the corrected read voltage level for the addressed memory block is stored in the history buffer; and reading the addressed memory block using at least one default read voltage level when the corrected read voltage level for the addressed memory block is not stored in the history buffer.

17. The method of claim 15, wherein the history buffer is volatile random access memory (RAM), and the method further comprises a first said scanning at a power-on of the nonvolatile memory device to initially populate the history buffer.

18. The method of claim 17, the method further comprising a second said scanning that occurs during a power-on of the nonvolatile memory device to update the history buffer, wherein a first speed of the first said scanning is greater than a second speed of the second said scanning.

19. The method of claim 15, wherein performing said scan includes reading a single sampled page among the plurality of pages of each memory block.

20. The method of claim 15, wherein performing said scan includes reading two or more sampled pages among the plurality of pages of each memory block.

* * * * *